(12) United States Patent
Chen et al.

(10) Patent No.: US 11,063,608 B2
(45) Date of Patent: Jul. 13, 2021

(54) CODING METHOD AND APPARATUS, AND DEVICE

(71) Applicant: HUAWEI TECHNOLOGIES CO., LTD., Guangdong (CN)

(72) Inventors: Ying Chen, Hangzhou (CN); Xiaocheng Liu, Hangzhou (CN); Lingchen Huang, Hangzhou (CN); Yue Zhou, Hangzhou (CN); Rong Li, Hangzhou (CN); Hejia Luo, Hangzhou (CN); Jun Wang, Hangzhou (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 0 days.

(21) Appl. No.: 16/661,931

(22) Filed: Oct. 23, 2019

(65) Prior Publication Data
US 2020/0059246 A1 Feb. 20, 2020

Related U.S. Application Data

(63) Continuation of application No. PCT/CN2018/085797, filed on May 7, 2018.

(30) Foreign Application Priority Data

May 5, 2017 (CN) .......................... 201710314076.5
Aug. 1, 2017 (CN) .......................... 201710648424.2

(51) Int. Cl.
*H03M 13/00* (2006.01)
*H03M 13/13* (2006.01)

(52) U.S. Cl.
CPC ....... *H03M 13/13* (2013.01); *H03M 13/6362* (2013.01)

(58) Field of Classification Search
CPC .......................... H03M 13/13; H03M 13/6363
See application file for complete search history.

(56) References Cited

U.S. PATENT DOCUMENTS

2015/0194987 A1 7/2015 Li et al.
2017/0047947 A1* 2/2017 Hong ................ H03M 13/2906
(Continued)

FOREIGN PATENT DOCUMENTS

CN 103684477 A 3/2014
CN 105811998 A 7/2016
(Continued)

OTHER PUBLICATIONS

Huawei et al: "Polar Code Construction for NR",3GPP Draft; R1-1608862, Oct. 14, 2016 (Oct. 14, 2016), XP051159189,total 8 pages.

(Continued)

*Primary Examiner* — Samir W Rizk
(74) *Attorney, Agent, or Firm* — Womble Bond Dickinson (US) LLP

(57) ABSTRACT

A polar code coding/decoding method, a sending device, and a receiving device are disclosed. The method includes: selecting, by a sending device, K non-punctured-position sequence numbers as a reference sequence number set based on a quantity K of information bits and a reliability-based order of N polarized channels of a polar code whose code length is N, where a reliability of a polarized channel corresponding to any sequence number in the reference sequence number set is greater than or equal to reliabilities of polarized channels corresponding to remaining (N–K) sequence numbers; determining, by the sending device, an information-bit sequence number set based on a determining condition and the reference sequence number set; and per- (Continued)

forming, by the sending device, polar coding on to-be-coded bits based on the information-bit sequence number set.

20 Claims, 8 Drawing Sheets

(56) References Cited

U.S. PATENT DOCUMENTS

2017/0077954 A1   3/2017   Shen et al.
2017/0111060 A1   4/2017   Huang et al.

FOREIGN PATENT DOCUMENTS

CN   106416083 A   2/2017
CN   106877973 A   6/2017

OTHER PUBLICATIONS

Ericsson: "Consideration of Implementation Aspects of Polar Codes",3GPP Draft; R1-1611318, Nov. 13, 2016 (Nov. 13, 2016),2016 (Nov. 13, 2016),XP051175299,total 6 pages.
Bin Li et al: "A RM-Polar Codes", Jul. 21, 2014 (Jul. 21, 2014), pp. 1-2,XP055676502,total 8 pages.
Huawei et al: "Polar code design and rate matching",3GPP Draft; R1-167209, Aug. 13, 2016 (Aug. 13, 2016), XP051142532,total 5 pages.

\* cited by examiner

CODING METHOD AND APPARATUS, AND DEVICE

CROSS-REFERENCE TO RELATED APPLICATIONS

This application is a continuation of International Application No. PCT/CN2018/085797, filed on May 7, 2018, which claims priority to Chinese Patent Application No. 201710314076.5, filed on May 5, 2017 and claims priority to Chinese Patent Application No. 201710648424.2, filed on Aug. 1, 2017. The disclosures of the aforementioned applications are hereby incorporated by reference in their entireties.

TECHNICAL FIELD

The present disclosure relates to the communications field, and in particular, to a polar code coding method, a polar code decoding method, a sending device, and a receiving device.

BACKGROUND

As a most fundamental radio access technology, channel coding plays an essential role in ensuring reliable data transmission. In an existing wireless communications system, a turbo code, a low-density parity-check (LDPC) code, and a polar code are generally used for channel coding. The turbo code cannot support information transmission at an excessively low or high code rate. For transmission of medium-size packets and small-size packets, it is difficult for the turbo code and LDPC code to achieve ideal performance at a limited code length due to coding/decoding characteristics of the turbo code and LDPC code. In terms of implementation, computing complexity of the turbo code and LDPC code is relatively high in a coding/decoding implementation process. It has been theoretically proved that the polar code is a high-performance code that can achieve a Shannon capacity and has relatively low coding/decoding complexity, and therefore the polar code is more widely applied.

However, as the wireless communications system rapidly evolves, a future communications system (for example, 5G) will have some new characteristics. For example, three most typical communications scenarios include enhanced mobile broadband (eMBB), massive machine type communication (mMTC), and ultra-reliable and low-latency communications (URLLC). These communications scenarios impose higher requirements on coding/decoding performance of the polar code.

However, in a current phase, the coding/decoding performance of the polar code in an application process is not desirable and needs to be further improved.

SUMMARY

The present disclosure provides a polar code coding method, a polar code decoding method, a sending device, and a receiving device, so as to improve polar code coding/decoding performance.

According to a first aspect, an embodiment of the present disclosure provides a polar code coding method. The method includes: selecting, by a sending device, K non-punctured-position sequence numbers as a reference sequence number set based on a quantity K of information bits and a reliability-based order of N polarized channels of a polar code whose code length is N, where a reliability of a polarized channel corresponding to any sequence number in the reference sequence number set is greater than or equal to a highest reliability in reliabilities of polarized channels corresponding to remaining (N−K) sequence numbers, and K is greater than or equal to 1 and is an integer; determining, by the sending device, an information-bit sequence number set based on a determining condition and the reference sequence number set, where the determining condition is set based on at least one of a code rate, a mother code length of the polar code, and a code weight; and performing, by the sending device, polar coding on to-be-coded bits based on the information-bit sequence number set.

In a possible implementation, the determining, by the sending device, an information-bit sequence number set based on a determining condition and the reference sequence number set includes: if the determining condition is not met, determining, by the sending device, the reference sequence number set as the information-bit sequence number set.

In a possible implementation, the determining, by the sending device, an information-bit sequence number set based on a determining condition and the reference sequence number set includes: if the determining condition is met, determining, by the sending device, $K_1$ first sequence numbers in the reference sequence number set, where a code weight corresponding to each of the $K_1$ first sequence numbers is $W_{min}$, and $W_{min}$ is equal to a minimum code weight in K code weights respectively corresponding to the K non-punctured-position sequence numbers; and selecting, by the sending device, $K_2$ second sequence numbers from available sequence numbers to replace $K_2$ first sequence numbers in the $K_1$ first sequence numbers, to obtain the information-bit sequence number set, where the available sequence numbers are sequence numbers in sequence numbers of the N polarized channels other than the reference sequence number set and a punctured-position sequence number, and $K_2 \leq K_1$, where the $K_2$ second sequence numbers meet any one of the following conditions: a code weight corresponding to each of the $K_2$ second sequence numbers is greater than $W_{min}$, and a reliability of a polarized channel corresponding to each second sequence number is greater than or equal to a reliability of a polarized channel corresponding to any one of a sequence number in the available sequence numbers other than the second sequence number and the punctured-position sequence number; a minimum sequence number in the $K_2$ second sequence numbers is greater than a maximum sequence number in the available sequence numbers other than the $K_2$ second sequence numbers; and a code weight of each of the $K_2$ second sequence numbers is greater than or equal to $2W_{min}$.

In a possible implementation, the determining condition is at least one of the following conditions: a mother code length is greater than or equal to a preset mother code length threshold; a code rate is greater than or equal to a preset code rate threshold; a quantity of minimum code weights in code weights corresponding to $K_1$ non-punctured-position sequence numbers included in the reference sequence number set is greater than or equal to a quantity threshold; and a minimum code weight in code weights corresponding to sequence numbers in the reference sequence number set is less than or equal to a preset code weight threshold.

In a possible implementation, the method further includes: determining, by the sending device, polar weights of the N polarized channels based on a polar weight calculation formula; and determining, by the sending device, an order of the polar weights of the N polarized channels as the reliability-based order of the N polarized channels, where the polar weight calculation formula is as follows:

$$W_i = \sum_{j=0}^{n-1} B_j \cdot a_1 \cdot [b_1 \cdot (2 \cdot c_1)^j + d_1]^{f_1} +$$
$$B_j \cdot a_2 \cdot [b_2 \cdot (2 \cdot c_2)^j + d_2]^{f_2} + (1 - B_j) \cdot a_3 \cdot [b_3 \cdot (2 \cdot c_3)^j + d_3]^{f_3},$$

where $W_i$ is a polar weight of an $i^{th}$ polarized channel, $i \in \{0, 1, \ldots, n-1\}$, $j \in \{0, 1, \ldots, n-1\}$, $B_j \in \{0,1\}$, $i = B_{n-1}B_{n-2} \ldots B_0$, $B_{n-1}B_{n-2} \ldots B_0$ is a binary expression of i, and a value range of each of $a_1$, $a_2$, $a_3$, $b_1$, $b_2$, $b_3$, $c_1$, $c_2$, $c_3$, $d_1$, $d_2$, $d_3$, $f_1$, $f_2$, and $f_3$ is $[-2, 2]$.

In a possible implementation, a group of values of $(a_1, b_1, c_1, d_1, f_1)$ is $(1, 1.07, 1, 0.5, \frac{1}{4})$, $(1, 1.1, 1, 0.5, 1, \frac{1}{4})$, or $(1, 1, 1, 0, \frac{1}{4})$, and $a_2 = a_3 = 0$.

In a possible implementation, a group of values of $(a_1, b_1, c_1, d_1, f_1)$ is $(1, 1.07, 1, 0.5, \frac{1}{4})$, $(1, 1.1, 1, 0.5, 1, \frac{1}{4})$, or $(1, 1, 1, 0, \frac{1}{4})$, a group of values of $(a_1, b_2, c_2, d_2, f_2)$ is $(\frac{1}{4}, 1, 1, 0, \frac{1}{16})$, and $a_3 = 0$.

In a possible implementation, a group of values of $(a_1, b_1, c_1, d_1, f_1)$ is $(1, 1.07, 1, 0.5, \frac{1}{4})$, $(1, 1.1, 1, 0.5, 1, \frac{1}{4})$, or $(1, 1, 1, 0, \frac{1}{4})$, a group of values of $(a_3, b_3, c_3, d_3, f_3)$ is $(1, 1.2, 1, 0, 1)$, and $a_2 = 0$.

In a possible implementation, when the determining condition is that a minimum code weight in code weights corresponding to sequence numbers in the reference sequence number set is less than or equal to a preset code weight threshold, the method further includes: calculating, by the sending device, $K_1$ code weights corresponding to $K_1$ sequence numbers included in the reference sequence number set; and determining, by the sending device, a minimum code weight in the $K_1$ code weights corresponding to the $K_1$ sequence numbers.

In a possible implementation, the method further includes:

determining, by the sending device, corrected polar weights of the N polarized channels based on a corrected polar weight calculation formula; and determining, by the sending device, an order of the corrected polar weights of the N polarized channels as the reliability-based order of the N polarized channels, where the corrected polar weight calculation formula is as follows:

$$W\_Modified(j) = \alpha * W(j)/\max(W) + (1-\alpha) * RW(j)/\max(RW), \text{ where}$$

PW_Modified(j) is a corrected polar weight of a j polarized channel, where $j = 0, 1, 2, \ldots, N-1$, a is a weighting coefficient, a is a positive constant greater than or equal to 0 and less than or equal to 1, for example, any value from 0.8-1, max(W) is a maximum polar weight value of a polarized channel, RW(j) is a row weight corresponding to the $j^{th}$ polarized channel, and max(RW) is a maximum row weight value of a polarized channel.

According to a second aspect, an embodiment of the present disclosure provides a polar code coding method. The method includes: calculating, by a sending device, polar weights of N polarized channels of a polar code whose code length is N based on a polar weight calculation formula, where the polar weight calculation formula is as follows:

$$W_i = \sum_{j=0}^{n-1} B_j \cdot a_1 \cdot [b_1 \cdot (2 \cdot c_1)^j + d_1]^{f_1} +$$
$$B_j \cdot a_2 \cdot [b_2 \cdot (2 \cdot c_2)^j + d_2]^{f_2} + (1 - B_j) \cdot a_3 \cdot [b_3 \cdot (2 \cdot c_3)^j + d_3]^{f_3},$$

where $W_i$ is a polar weight of an $i^{th}$ polarized channel, $i \in \{0, 1, \ldots, n-1\}$, $j \in \{0, 1, \ldots, n-1\}$, $B_j \in \{0,1\}$, $i = B_{n-1}B_{n-2} \ldots B_0$, $B_{n-1}B_{n-2} \ldots B_0$ is a binary expression of i, and a value range of each of $a_1$, $a_2$, $a_3$, $b_1$, $b_2$, $b_3$, $c_1$, $c_2$, $c_3$, $d_1$, $d_2$, $d_3$, $f_1$, $f_2$, and $f_3$ is $[-2, 2]$; where determining, by the sending device, an information-bit sequence number set based on a quantity K of information bits and the polar weights of the N polarized channels; and performing, by the sending device, polar coding on to-be-coded bits based on the information-bit sequence number set.

In a possible implementation, a group of values of $(a_1, b_1, c_1, d_1, f_1)$ is $(1, 1.07, 1, 0.5, \frac{1}{4})$, $(1, 1.1, 1, 0.5, 1, \frac{1}{4})$, or $(1, 1, 1, 0, \frac{1}{4})$, and $a_2 = a_3 = 0$.

In a possible implementation, a group of values of $(a_1, b_1, c_1, d_1, f_1)$ is $(1, 1.07, 1, 0.5. \frac{1}{4})$, $(1, 1.1, 1, 0.5, 1, \frac{1}{4})$, or $(1, 1, 1, 0, \frac{1}{4})$, a group of values of $(a_2, b_2, c_2, d_2, f_2)$ is $(\frac{1}{4}, 1, 1, 0, \frac{1}{16})$, and $a_3 = 0$.

In a possible implementation, a group of values of $(a_1, b_1, c_1, d_1, f_1)$ is $(1, 1.07, 1, 0.5, \frac{1}{4})$, $(1, 1.1, 1, 0.5, 1, \frac{1}{4})$, or $(1, 1, 1, 0, \frac{1}{4})$, a group of values of $(a_3, b_3, c_3, d_3, f_3)$ is $(1, 1.2, 1, 0, 1)$, and $a_2 = 0$.

In a possible implementation, the method further includes: determining, by the sending device, corrected polar weights of the N polarized channels based on a corrected polar weight calculation formula; and determining, by the sending device, an order of the corrected polar weights of the N polarized channels as the reliability-based order of the N polarized channels, where the corrected polar weight calculation formula is as follows:

$$W\_Modified(j) = \alpha * W(j)/\max(W) + (1-\alpha) * RW(j)/\max(RW), \text{ where}$$

PW_Modified(j) is a corrected polar weight of a $j^{th}$ polarized channel, where $j = 0, 1, 2, \ldots, N-1$, a is a weighting coefficient, a is a positive constant greater than or equal to 0 and less than or equal to 1, for example, any value from 0.8-1, max(W) is a maximum polar weight value of a polarized channel, RW(j) is a row weight corresponding to the $j^{th}$ polarized channel, and max(RW) is a maximum row weight value of a polarized channel.

According to a third aspect, an embodiment of the present disclosure provides a polar code decoding method. The method includes: selecting, by a receiving device, K non-punctured-position sequence numbers as a reference sequence number set based on a quantity K of information bits and a reliability-based order of N polarized channels of a polar code whose code length is N, where a reliability of a polarized channel corresponding to any sequence number in the reference sequence number set is greater than or equal to a highest reliability in reliabilities of polarized channels corresponding to remaining (N−K) sequence numbers, and K is greater than or equal to 1 and is an integer; determining, by the receiving device, an information-bit sequence number set based on a determining condition and the reference sequence number set, where the determining condition is set based on at least one of a code rate, a mother code length of the polar code, and a code weight; and performing, by the sending device, decoding on a to-be-decoded sequence based on the information-bit sequence number set.

In a possible implementation, the determining, by the receiving device, an information-bit sequence number set based on a determining condition and the reference sequence number set includes: if the determining condition is not met, determining, by the receiving device, the reference sequence number set as the information-bit sequence number set.

In a possible implementation, the determining, by the receiving device, an information-bit sequence number set based on a determining condition and the reference sequence number set includes: if the determining condition is met, determining, by the receiving device, $K_1$ first sequence numbers in the reference sequence number set, where a code weight corresponding to each of the $K_1$ first sequence numbers is $W_{min}$, and $W_{min}$ is equal to a minimum code weight in K code weights respectively corresponding to the K non-punctured-position sequence numbers; and selecting, by the receiving device, $K_2$ second sequence numbers from available sequence numbers to replace $K_2$ first sequence numbers in the $K_1$ first sequence numbers, to obtain the information-bit sequence number set, where the available sequence numbers are sequence numbers in sequence numbers of the N polarized channels other than the reference sequence number set and a punctured-position sequence number, and $K_2 \leq K_1$, where the $K_2$ second sequence numbers meet any one of the following conditions: a code weight corresponding to each of the $K_2$ second sequence numbers is greater than $W_{min}$, and a reliability of a polarized channel corresponding to each second sequence number is greater than or equal to a reliability of a polarized channel corresponding to any one of a sequence number in the available sequence numbers other than the second sequence number and the punctured-position sequence number; a minimum sequence number in the $K_2$ second sequence numbers is greater than a maximum sequence number in the available sequence numbers other than the $K_2$ second sequence numbers; and a code weight of each of the $K_2$ second sequence numbers is greater than or equal to $2W_{min}$.

In a possible implementation, the determining condition is at least one of the following conditions: a mother code length is greater than or equal to a preset mother code length threshold; a code rate is greater than or equal to a preset code rate threshold; a quantity of minimum code weights in code weights corresponding to $K_1$ non-punctured-position sequence numbers included in the reference sequence number set is greater than or equal to a quantity threshold; and a minimum code weight in code weights corresponding to sequence numbers in the reference sequence number set is less than or equal to a preset code weight threshold.

In a possible implementation, the method further includes: determining, by the receiving device, polar weights of the N polarized channels based on a polar weight calculation formula; and determining, by the receiving device, an order of the polar weights of the N polarized channels as the reliability-based order of the N polarized channels, where the polar weight calculation formula is as follows:

$$W_i = \sum_{j=0}^{n-1} B_j \cdot a_1 \cdot [b_1 \cdot (2 \cdot c_1)^j + d_1]^{f_1} + B_j \cdot a_2 \cdot [b_2 \cdot (2 \cdot c_2)^j + d_2]^{f_2} + (1 - B_j) \cdot a_3 \cdot [b_3 \cdot (2 \cdot c_3)^j + d_3]^{f_3},$$

where $W_i$ is a polar weight of an $i^{th}$ polarized channel, $i \in \{0, 1, \ldots, n-1\}$, $j \in \{0, 1, \ldots, n-1\}$, $B_j \in \{0,1\}$, $i = B_{n-1}B_{n-2} \ldots B_0$, $B_{n-1}B_{n-2} \ldots B_0$ is a binary expression of i, and a value range of each of $a_1, a_2, a_3, b_1, b_2, b_3, c_1, c_2, c_3, d_1, d_2, d_3, f_1, f_2$, and $f_3$ is $[-2, 2]$.

In a possible implementation, a group of values of $(a_1, b_1, c_1, d_1, f_1)$ is $(1, 1.07, 1, 0.5, \frac{1}{4})$, $(1, 1.1, 1, 0.5, \frac{1}{4})$, or $(1, 1, 1, 0, \frac{1}{4})$, and $a_2 = a_3 = 0$.

In a possible implementation, a group of values of $(a_1, b_1, c_1, d_1, f_1)$ is $(1, 1.07, 1, 0.5, \frac{1}{4})$, $(1, 1.1, 1, 0.5, \frac{1}{4})$, or $(1, 1, 1, 0, \frac{1}{4})$, a group of values of $(a_2, b_2, c_2, d_2, f_2)$ is $(\frac{1}{4}, 1, 1, 0, \frac{1}{16})$, and $a_3 = 0$.

In a possible implementation, a group of values of $(a_1, b_1, c_1, d_1, f_1)$ is $(1, 1.07, 1, 0.5, \frac{1}{4})$, $(1, 1.1, 1, 0.5, \frac{1}{4})$, or $(1, 1, 1, 0, \frac{1}{4})$, a group of values of $(a_3, b_3, c_3, d_3, f_3)$ is $(1, 1.2, 1, 0, 1)$, and $a_2 = 0$.

In a possible implementation, when the determining condition is that a minimum code weight in code weights corresponding to sequence numbers in the reference sequence number set is less than or equal to a preset code weight threshold, the method further includes: calculating, by the receiving device, $K_1$ code weights corresponding to $K_1$ sequence numbers included in the reference sequence number set; and determining, by the receiving device, a minimum code weight in the $K_1$ code weights corresponding to the $K_1$ sequence numbers.

In a possible implementation, the method further includes: determining, by the receiving device, corrected polar weights of the N polarized channels based on a corrected polar weight calculation formula; and determining, by the sending device, an order of the corrected polar weights of the N polarized channels as the reliability-based order of the N polarized channels, where the corrected polar weight calculation formula is as follows:

$$W\_Modified(j) = \alpha * W(j)/\max(W) + (1-\alpha) * RW(j)/\max(RW), \text{ where}$$

PW_Modified(j) is a corrected polar weight of a $j^{th}$ polarized channel, where $j = 0, 1, 2, \ldots, N-1$, a is a weighting coefficient, a is a positive constant greater than or equal to 0 and less than or equal to 1, for example, any value from 0.8-1, max(W) is a maximum polar weight value of a polarized channel, RW(j) is a row weight corresponding to the $j^{th}$ polarized channel, and max(RW) is a maximum row weight value of a polarized channel.

According to a fourth aspect, an embodiment of the present disclosure provides a polar code decoding method. The method includes:

calculating, by a receiving device, polar weights of N polarized channels of a polar code whose code length is N based on a polar weight calculation formula, where the polar weight formula is as follows:

$$W_i = \sum_{j=0}^{n-1} B_j \cdot a_1 \cdot [b_1 \cdot (2 \cdot c_1)^j + d_1]^{f_1} + B_j \cdot a_2 \cdot [b_2 \cdot (2 \cdot c_2)^j + d_2]^{f_2} + (1 - B_j) \cdot a_3 \cdot [b_3 \cdot (2 \cdot c_3)^j + d_3]^{f_3},$$

where $W_i$ is a polar weight of an $i^{th}$ polarized channel, $i \in \{0, 1, \ldots, n-1\}$, $j \in \{0, 1, \ldots, n-1\}$, $B_j \in \{0,1\}$, $i = B_{n-1}B_{n-2} \ldots B_0$, $B_{n-1}B_{n-2} \ldots B_0$ is a binary expression of i, and a value range of each of $a_1, a_2, a_3, b_1, b_2, b_3, c_1, c_2, c_3, d_1, d_2, d_3, f_1, f_2$, and $f_3$ is $[-2, 2]$; where determining, by the receiving device, an information-bit sequence number set based on a quantity K of information bits and the polar weights of the N polarized channels; and performing, by the receiving device, decoding on a to-be-decoded sequence based on the information-bit sequence number set.

In a possible implementation, a group of values of ($a_1$, $b_1$, $c_1$, $d_1$, $f_1$) is (1, 1.07, 1, 0.5, ¼), (1, 1.1, 1, 0.5, 1, ¼), or (1, 1, 1, 0, ¼), and $a_2$=$a_3$=0.

In a possible implementation, a group of values of ($a_1$, $b_1$, $c_1$, $d_1$, $f_1$) is (1, 1.07, 1, 0.5, ¼), (1, 1.1, 1, 0.5, 1, ¼), or (1, 1, 1, 0, ¼), a group of values of ($a_2$, $b_2$, $c_2$, $d_2$, $f_2$) is (¼, 1, 1,0,¹⁄₁₆), and $a_3$=0.

In a possible implementation, a group of values of ($a_1$, $b_1$, $c_1$, $d_1$, $f_1$) is (1, 1.07, 1, 0.5, ¼), (1, 1.1, 1, 0.5, 1, ¼), or (1, 1, 1, 0, ¼), a group of values of ($a_3$, $b_3$, $c_3$, $d_3$, $f_3$) is (1, 1.2, 1, 0, 1), and $a_3$=0.

In a possible implementation, the method further includes: determining, by the receiving device, corrected polar weights of the N polarized channels based on a corrected polar weight calculation formula; and determining, by the sending device, an order of the corrected polar weights of the N polarized channels as the reliability-based order of the N polarized channels, where the corrected polar weight calculation formula is as follows:

$$W\_Modified(j)=\alpha* W(j)/\max(W)+(1-\alpha)*RW(j)/\max(RW), \text{ where}$$

PW_Modified(j) is a corrected polar weight of a $j^{th}$ polarized channel, where j=0, 1, 2, . . . , N−1, a is a weighting coefficient, a is a positive constant greater than or equal to 0 and less than or equal to 1, for example, any value from 0.8-1, max(W) is a maximum polar weight value of a polarized channel, RW(j) is a row weight corresponding to the $j^{th}$ polarized channel, and max(RW) is a maximum row weight value of a polarized channel.

According to a fifth aspect, an embodiment of the present disclosure provides a polar code coding method. The method includes: calculating, by a sending device, a polar weight of each of N polarized channels of a polar code whose code length is N based on a polar weight calculation formula:

$$W_i = \left( \sum_{j=0}^{n-1} B_j \cdot \beta^j + \sum_{m \in \Xi} \frac{1}{2^m} \cdot B_j \times \beta^{\frac{1}{2^m}j} \right),$$

where $W_i$ is a polar weight of an $i^{th}$ polarized channel, $B_j \in \{0,1\}$, j∈{0, 1, . . . , n−1}, i∈{0, 1, . . . , n−1}, i=$B_{n-1}B_{n-2}$ . . . $B_0$, $B_{n-1}B_{n-2}$ . . . $B_0$ is a binary expression of i, and Ξ=[1, 2, 3, . . . ] represents a value set of m, β=2¼, and n=$\log_2$(N); determining, by the sending device, an information-bit sequence number set based on a quantity K of information bits and the polar weights of the N polarized channels; and performing, by the sending device, polar coding on to-be-coded bits based on the information-bit sequence number set.

It should be noted that, the polar code coding method provided in the fifth aspect and the polar code coding method provided in the third aspect are different in the provided polar weight calculation formulas. After the polar weights of the polarized channels are calculated based on the respectively provided calculation formulas, processes in which the reliability-based order of the polarized channels is determined and the information-bit sequence number set is determined, and polar coding is performed based on the information-bit sequence number set are the same.

According to a sixth aspect, an embodiment of the present disclosure provides a polar code decoding method. The method includes: calculating, by a receiving device, a polar weight of each of N polarized channels of a polar code whose code length is N based on a polar weight calculation formula:

$$W_i = \left( \sum_{j=0}^{n-1} B_j \cdot \beta^j + \sum_{m \in \Xi} \frac{1}{2^m} \cdot B_j \times \beta^{\frac{1}{2^m}j} \right),$$

where $W_i$ is a polar weight of an $i^{th}$ polarized channel, $B_j \in \{0,1\}$, j∈{0, 1, . . . , n−1}, i∈{0, 1, . . . , n−1}, i=$B_{n-1}B_{n-2}$ . . . $B_0$, $B_{n-1}B_{n-2}$ . . . $B_0$ is a binary expression of i, and Ξ=[1, 2, 3, . . . ] represents a value set of m, β=2¼, and n=$\log_2$(N); determining, by the receiving device, an information-bit sequence number set based on a quantity K of information bits and the polar weights of the N polarized channels; and performing, by the receiving device, decoding on a to-be-decoded sequence based on the information-bit sequence number set.

In a possible implementation, the method further includes: determining, by the sending device, corrected polar weights of the N polarized channels based on a corrected polar weight calculation formula; and determining, by the sending device, an order of the corrected polar weights of the N polarized channels as the reliability-based order of the N polarized channels, where the corrected polar weight calculation formula is as follows:

$$W\_Modified(j)=\alpha* W(j)/\max(W)+(1-\alpha)*RW(j)/\max(RW), \text{ where}$$

PW_Modified(j) is a corrected polar weight of a $j^{th}$ polarized channel, where j=0, 1, 2, . . . , N−1, a is a weighting coefficient, a is a positive constant greater than or equal to 0 and less than or equal to 1, for example, any value from 0.8-1, max(W) is a maximum polar weight value of a polarized channel, RW(j) is a row weight corresponding to the $j^{th}$ polarized channel, and max(RW) is a maximum row weight value of a polarized channel.

Similarly, the polar code decoding method provided in the sixth aspect and the polar code decoding method provided in the fourth aspect are different in the provided polar weight calculation formulas. After the polar weights of the polarized channels are calculated based on the respectively provided calculation formulas, processes in which the reliability-based order of the polarized channels is determined and the information-bit sequence number set is determined, and decoding is performed on the to-be-decoded sequence based on the information-bit sequence number set are the same.

Specifically, in the polar code coding methods provided in the third aspect and the fifth aspect, after the polar weights of the polarized channels are obtained through calculation and the reliability-based order of the polarized channels is determined based on the polar weights, a technical solution for determining an information-bit sequence number set provided in the first aspect of the present disclosure may be used for a process in which the information-bit sequence number set is determined. Certainly, a technical solution for determining an information-bit sequence number set in the prior art may alternatively be used. This embodiment of the present disclosure sets no limitation thereto.

Similarly, in the polar code decoding methods provided in the fourth aspect and the sixth aspect, after the polar weights of the polarized channels are obtained through calculation and the reliability-based order of the polarized channels is determined based on the polar weights, a technical solution for determining an information-bit sequence number set provided in the second aspect of the present disclosure may be used for a process in which the information-bit sequence number set is determined. Similarly, a technical solution for determining an information-bit sequence number set in the prior art may alternatively be used.

According to a seventh aspect, an embodiment of the present disclosure provides a polar code coding method. The method includes: obtaining, by a sending device, a maximum mother code sequence, where the maximum mother code sequence is {1,2,3,5,9,17,4,33,6,7,10,65,11,18,13,19, 129,21,34,35,25,8,37,66,257,12,67,41,14,69,20,49,15,130, 73,22,131,23,36,513,133,26,81,38,27,137,39,258,29,68,42, 97,259,43,145,70,261,50,16,71,45,74,51, 265,132,161,75, 24,53,514,134,82,77,515,273,135,28,83,57,138,40,193,517, 30,85,98,139,260,289, 31,44,521,99,146,141,89,262,147, 72,46,101,263,52,529,47,266,149,321,162,76,105,54,267, 163,15 3,78,55,516,274,545,269,136,84,165,58,113,79,275, 194,518,59,385,86,140,195,169,519,277,290,3 2,87,61,522, 100,577,142,291,197,90,523,281,148,177,102,143,91,264, 293,530,48,201,525,103,150, 322,93,531,106,268,151,323, 297,164,641,107,154,56,209,533,546,270,325,166,114,155, 80,276,10 9,547,305,271,167,60,386,537,115,157,329,196, 170,520,278,225,549,387,88,62,117,578,171,279,2 92,198, 769,63,524,389,282,579,337,553,178,144,199,92,173,121, 294,283,202,526,179,104,581,39 3,295,94,532,203,561, 527,285,152,324,298,181,353,642,95,108,585,210,534,299, 205,643,401,326, 156,211,185,535,110,548,306,272,327, 301,168,645,538,116,593,111,158,330,307,213,226,550, 388, 539,417,118,159,331,172,280,649,227,551,309,770, 64,217,390,541,119,580,338,554,609,333,200, 771,174, 229,122,391,284,339,555,313,180,657,582,175,394,123, 296,449,773,204,562,528,286,233, 583,341,557,182,354, 395,96,125,586,563,287,300,206,777,183,355,644,402,673, 397,587,345,212, 186,536,241,207,565,403,328,302,357, 646,594,187,112,589,308,214,785,303,647,540,405,418, 595, 569,160,332,215,189,361,650,228,552,310,705,419, 218,542,120,597,610,651,409,334,311,772,23 0,801,219, 392,543,340,556,421,314,611,369,658,335,176,653,231, 124,450,601,774,315,221,659,2 34,584,342,558,396,613, 451,425,775,126,564,288,235,343,559,317,778,184,356, 661,833,674,398, 127,588,453,346,617,242,208,566,779, 404,237,675,433,358,358,399,347,188,665,590,243,567, 786,304, 457,781,359,648,406,596,677,570,625,591,349, 216,787,190,362,245,706,407,420,571,897,598,19 1,363, 652,410,312,707,465,681,789,802,220,544,249,422,599, 573,612,370,411,336,365,654,232,8 03,709,602,423,316, 222,793,371,660,689,614,655,413,452,426,603,776,481, 805,223,236,344,560, 318,713,615,373,662,834,427,128, 454,605,618,319,780,663,835,238,809,676,434,400,455, 348,429, 619,377,666,244,568,721,239,458,782,435,360, 837,678,626,667,592,350,788,621,246,459,817,78 3,408, 679,572,437,898,627,351,192,364,669,841,247,708,466, 682,790,737,461,899,250,600,574,4 12,629,467,683,441, 791,366,804,710,251,424,575,901,794,372,849,690,367, 656,414,711,604,469, 685,482,633,806,224,795,253,714, 691,616,374,415,428,905,483,807,606,320,715,473,797, 375,664, 836,810,693,865,456,430,607,620,485,378,722, 240,811,717,436,913,838,431,379,668,723,697,62 2,460, 818,784,489,839,813,680,438,628,352,623,381,670,842, 248,819,725,738,462,439,900,929,6 30,671,843,468,684, 442,792,739,497,463,821,252,576,729,902,631,850,443, 368,845,712,470,686, 741,634,903,796,851,254,825,692, 416,471,687,445,906,484,635,808,961,255,716,474,798, 376,745, 853,694,866,907,608,486,637,475,799,812,718, 695,867,914,432,909,487,380,857,724,698,753,71 9,477, 915,490,840,814,869,699,624,382,820,726,491,815,440, 917,930,383,672,844,727,701,873,7 40,498,464,822,493, 931,730,632,444,921,846,499,823,742,731,904,852,933, 826,881,847,472,688, 446,743,636,501,962,256,827,733, 746,854,447,908,963,937,638,476,800,747,505,855,829, 696,868, 910,488,639,965,858,754,720,478,916,749,945, 870,911,859,700,755,479,492,816,969,871,918,38 4,861, 728,702,874,757,919,494,932,703,875,922,500,824,977, 495,732,761,934,882,923,848,877,7 44,502,935,828,734, 883,448,925,503,964,938,993,735,748,506,856,830,885, 939,640,966,507,831, 750,946,912,967,860,941,889,756, 480,751,509,970,947,872,862,758,971,920,949,863,704, 876,759, 978,496,973,762,924,979,953,878,763,936,884, 879,926,504,981,994,736,765,886,927,940,995,50 8,832, 985,887,968,942,997,890,752,510,948,943,891,511,972, 1001,950,864,893,760,974,951,980, 954,1009,975,764,955, 880,982,766,928,983,957,996,767,986,888,998,987,944, 999,892,512,989,10 02,894,1003,952,895,1010,976,1005, 956,1011,984,958,1013,768,959,988,1017,1000,990,991, 1004, 896,1006,1012,1007,1014,960,1015,1018,1019,992, 1021,1008,1016,1020,1022,1023,1024}; and performing, polar coding based on the maximum mother code sequence.

According to an eighth aspect, an embodiment of the present disclosure provides a polar code coding method. The method includes: obtaining, by a sending device, a maximum mother code sequence, where the maximum mother code sequence is {1,2,3,5,9,17,4,33,6,7,10,65,11,18,13,19, 129,34,21,35,8,25,37,66,12,257,67,41,14,20,69,15,130,49, 22,73,131,36,23,26,513,133,38,81,27,39,258,68,137,42,29, 259,97,70,43,16,145,50,261,71,45,74,13 2,51,24,265,75, 161,514,134,53,82,28,77,515,135,40,273,83,138,57,30,517, 260,193,98,139,85,44,3 1,146,289,99,262,72,521,141,46, 89,147,52,263,101,47,266,76,162,529,149,54,321,267,105, 78,163, 516,136,55,274,84,153,58,269,79,545,165,518,275, 194,113,140,86,59,32,519,385,290,195,100,277, 169,87, 522,142,61,90,148,291,577,264,197,102,523,143,48,281, 91,177,530,150,293,103,322,525, 268,201,106,93,164,531, 151,56,323,154,297,107,270,80,641,546,166,533,276,209, 114,155,325,60, 271,109,547,167,520,386,305,196,115, 278,170,88,537,157,62,329,549,387,292,225,578,279,198,1 71,117,524,144,63,282,92,178,769,579,389,294,199,104, 553,337,173,526,283,202,121,94,179,532, 152,295,581, 324,527,393,298,203,108,285,95,642,561,181,534,210,353, 156,326,299,585,272,205, 110,643,548,168,535,401,306, 211,116,185,327,538,158,301,111,330,645,550,388,307, 226,593,280, 213,172,118,539,159,64,331,551,417,770, 227,580,390,309,200,649,119,554,338,174,541,284,217, 122,333,180,771,609,391,296,229,582,555,339,175,528, 394,313,204,123,286,96,657,562,182,773, 583,449,354, 557,395,341,300,233,586,287,206,125,644,563,183,536, 402,212,355,186,328,777,587, 397,207,112,673,345, 646,565,403,308,241,594,214,187,357,540,160,303,589, 332,647,552,41 8,785,228,595,405,310,215,650,120,569, 189,542,218,361,334,419,772,705,610,392,311,230,651,5 97,556,340,176,543,409,314,219,124,335,658,801,611,421, 774,231,584,450,369,653,558,396,342, 315,234,601,288, 221,126,659,564,184,775,613,451,356,559,425,343,778, 235,588,398,317,208,127, 674,346,661,566,404,242,833, 453,188,358,779,617,399,304,237,590,675,347,648,567, 433,786,24 3,596,406,216,665,359,570,190,781,591,457, 362,677,349,420,787,706,625,407,312,245,652,598,5 71,191,544,410,220,363,336,897,802,707,612,422,789,232, 681,599,465,370,654,573,411,316,249, 602,222,365,660, 803,423,776,709,614,452,371,655,560,426,344,793,236, 603,413,318,223,128,689, 662,805,615,481,834,454,427, 373,780,713,618,400,319,238,605,676,348,663,568,434, 244,835,45 5,666,360,809,619,429,782,239,592,458,377, 678,350,435,788,721,626,408,246,667,837,572, 192,7 83,621,459,364,679,351,898,817,708,627,437,790,247,682, 600,466,669,574,412,250,841,461,366, 899,804,737,424, 791,710,683,629,467,372,656,575,441,794,251,604,414, 224,367,690,901,806,711, 616,482,849,685,469,428,374, 795,714,633,415,320,253,606,691,664,807,483,836,456, 905,375,81 0,715,620,430,797,240,607,473,378,693,436, 722,865,485,668,838,811,431,784,717,622,460,379,6 80,352,913,818,723,628,438,248,697,839,670,813,623,489, 842,462,381,900,819,738,439,792,725, 684,630,468,671, 576,442,252,843,463,368,929,739,902,821,712,631,497, 850,686,470,443,796,729, 634,416,254,845,692,903,808, 741,484,851,687,471,906,376,825,716,635,445,798,255, 608,474,69 4,961,866,486,907,853,812,745,432,799,718, 637,475,380,695,914,724,867,487,698,840,909,814,7 19,624,490,857,477,382,915,820,753,440,726,699,869,672, 815,491,844,464,383,930,740,917,822, 727,632,498,701, 444,730,873,493,846,931,904,823,742,499,852,688,472, 921,826,731,636,446,256, 847,933,743,962,881,501,908, 854,827,746,447,800,733,638,476,696,963,868,488,937, 855,747,91 0,829,720,639,505,858,478,916,754,965,700, 870,911,816,749,492,859,479,384,945,755,918,728,8 71,702,969,874,494,861,932,919,824,757,500,703,922,732, 875,495,848,934,744,977,882,502,923, 828,761,448,734, 877,935,964,883,503,938,856,748,925,830,735,640,506, 993,966,939,885,912,831, 750,507,860,480,946,756,967, 872,941,751,970,889,509,862,947,920,758,704,971,876, 496,863,94 9,759,978,924,762,973,878,936,979,884,504, 953,763,926,736,879,994,981,940,886,927,832,765,5 08,995,968,887,942,752,985,890,510,948,997,943,972,891, 511,864,950,760,1001,974,893,951,980, 954,764,975,880, 1009,982,955,928,766,996,983,888,957,767,986,998,944, 987,892,512,999,1002, 989,894,952,1003,976,895,1010, 956,1005,1011,984,958,768,1013,959,988,1000,1017,990, 1004,99 1,896,1006,1012,1007,1014,960,1015,1018,1019, 992,1021,1008,1016,1020,1022,1023,1024}; and performing, polar coding based on the maximum mother code sequence.

According to a ninth aspect, an embodiment of the present disclosure provides a polar code decoding method. The method includes: obtaining, by a receiving device, a maximum mother code sequence, where the maximum mother code sequence is {1,2,3,5,9,17,4,33,6,7,10,65,118,13,19, 129,21,34,35,25,8,37,66,257,12,67,41,14,69,20,49,15,130, 73,22,131,23,36,513,133,26,81,38,27,137,39,258,29,68,42, 97,259,43,145,70,261,50,16,71,45,74,51, 265,132,161,75, 24,53,514,134,82,77,515,273,135,28,83,57,138,40,193,517, 30,85,98,139,260,289, 31,44,521,99,146,141,89,262,147, 72,46,101,263,52,529,47,266,149,321,162,76,105,54,267, 163,15 3,78,55,516,274,545,269,136,84,165,58,113,79,275, 194,518,59,385,86,140,195,169,519,277,290,3 2,87,61,522, 100,577,142,291,197,90,523,281,148,177,102,143,91,264, 293,530,48,201,525,103,150, 322,93,531,106,268,151,323, 297,164,641,107,154,56,209,533,546,270,325,166,114,155, 80,276,10 9,547,305,271,167,60,386,537,115,157,329,196, 170,520,278,225,549,387,88,62,117,578,171,279,2 92,198, 769,63,524,389,282,579,337,553,178,144,199,92,173,121, 294,283,202,526,179,104,581,39 3,295,94,532,203,561, 527,285,152,324,298,181,353,642,95,108,585,210,534,299, 205,643,401,326, 156,211,185,535,110,548,306,272,327, 301,168,645,538,116,593,111,158,330,307,213,226,550, 388, 539,417,118,159,331,172,280,649,227,551,309,770, 64,217,390,541,119,580,338,554,609,333,200, 771,174, 229,122,391,284,339,555,313,180,657,582,175,394,123, 296,449,773,204,562,528,286,233, 583,341,557,182,354, 395,96,125,586,563,287,300,206,777,183,355,644,402,673, 397,587,345,212, 186,536,241,207,565,403,328,302,357, 646,594, 187,112,589,308,214,785,303,647,540,405,418, 595, 569,160,332,215,189,361,650,228,552,310,705,419, 218,542,120,597,610,651,409,334,311,772,23 0,801,219, 392,543,340,556,421,314,611,369,658,335,176,653,231, 124,450,601,774,315,221,659,2 34,584,342,558,396,613, 451,425,775,126,564,288,235,343,559,317,778,184,356, 661,833,674,398, 127,588,453,346,617,242,208,566,779, 404,237,675,433,358,399,347,188,665,590,243,567,786, 304, 457,781,359,648,406,596,677,570,625,591,349,216, 787,190,362,245,706,407,420,571,897,598,19 1,363,652, 410,312,707,465,681,789,802,220,544,249,422,599,573, 612,370,411,336,365,654,232,8 03,709,602,423,316,222, 793,371,660,689,614,655,413,452,426,603,776,481,805, 223,236,344,560, 318,713,615,373,662,834,427,128,454, 605,618,319,780,663,835,238,809,676,434,400,455,348, 429, 619,377,666,244,568,721,239,458,782,435,360,837, 678,626,667,592,350,788,621,246,459,817,78 3,408,679, 572,437,898,627,351,192,364,669,841,247,708,466,682, 790,737,461,899,250,600,574,4 12,629,467,683,441,791, 366,804,710,251,424,575,901,794,372,849,690,367,656, 414,711,604,469, 685,482,633,806,224,795,253,714,691, 616,374,415,428,905,483,807,606,320,715,473,797,375, 664, 836,810,693,865,456,430,607,620,485,378,722,240, 811,717,436,913,838,431,379,668,723,697,62 2,460,818, 784,489,839,813,680,438,628,352,623,381,670,842,248, 819,725,738,462,439,900,929,6 30,671,843,468,684,442, 792,739,497,463,821,252,576,729,902,631,850,443,368, 845,712,470,686, 741,634,903,796,851,254,825,692,416, 471,687,445,906,484,635,808,961,255,716,474,798,376, 745, 853,694,866,907,608,486,637,475,799,812,718,695, 867,914,432,909,487,380,857,724,698,753,71 9,477,915, 490,840,814,869,699,624,382,820,726,491,815,440,917, 930,383,672,844,727,701,873,7 40,498,464,822,493,931, 730,632,444,921,846,499,823,742,731,904,852,933,826, 881,847,472,688, 446,743,636,501,962,256,827,733,746, 854,447,908,963,937,638,476,800,747,505,855,829,696, 868, 910,488,639,965,858,754,720,478,916,749,945,870, 911,859,700,755,479,492,816,969,871,918,38 4,861,728, 702,874,757,919,494,932,703,875,922,500,824,977,495, 732,761,934,882,923,848,877,7 44,502,935,828,734,883, 448,925,503,964,938,993,735,748,506,856,830,885,939, 640,966,507,831, 750,946,912,967,860,941,889,756,480, 751,509,970,947,872,862,758,971,920,949,863,704,876, 759, 978,496,973,762,924,979,953,878,763,936,884,879, 926,504,981,994,736,765,886,927,940,995,50 8,832,985, 887,968,942,997,890,752,510,948,943,891,511,972,1001, 950,864,893,760,974,951,980, 954,1009,975,764,955,880, 982,766,928,983,957,996,767,986,888,998,987,944,999, 892,512,989,10 02,894,1003,952,895,1010,976,1005,956, 1011,984,958,1013,768,959,988,1017,1000,990,991,1004, 896,1006,1012,1007,1014,960,1015,1018,1019,992,1021, 1008,1016,1020,1022,1023,1024}; and performing, decoding on a to-be-decoded sequence based on the maximum mother code sequence.

According to a tenth aspect, an embodiment of the present disclosure provides a polar code decoding method. The method includes: obtaining, by a receiving device, a maximum mother code sequence, where the maximum mother code sequence is {1,2,3,5,9,17,4,33,6,7,10,65,11,18,13,19, 129,34,21,35,8,25,37,66,12,257,67,41,14,20,69,15,130,49, 22,73,131,36,23,26,513,133,38,81,27,39,258,68,137,42,29, 259,97,70,43,16,145,50,261,71,45,74,13 2,51,24,265,75, 161,514,134,53,82,28,77,515,135,40,273,83,138,57,30,517, 260,193,98,139,85,44,3 1,146,289,99,262,72,521,141,46, 89,147,52,263,101,47,266,76,162,529,149,54,321,267,105, 78,163, 516,136,55,274,84,153,58,269,79,545,165,518,275, 194,113,140,86,59,32,519,385,290,195,100,277, 169,87, 522,142,61,90,148,291,577,264,197,102,523,143,48,281, 91,177,530,150,293,103,322,525, 268,201,106,93,164,531, 151,56,323,154,297,107,270,80,641,546,166,533,276,209, 114,155,325,60, 271,109,547,167,520,386,305,196,115, 278,170,88,537,157,62,329,549,387,292,225,578,279,198,1 71,117,524,144,63,282,92,178,769,579,389,294,199,104, 553,337,173,526,283,202,121,94,179,532, 152,295,581, 324,527,393,298,203,108,285,95,642,561,181,534,210,353, 156,326,299,585,272,205, 110,643,548,168,535,401,306, 211,116,185,327,538,158,301,111,330,645,550,388,307, 226,593,280, 213,172,118,539,159,64,331,551,417,770, 227,580,390,309,200,649,119,554,338,174,541,284,217, 122,333,180,771,609,391,296,229,582,555,339,175,528, 394,313,204,123,286,96,657,562,182,773, 583,449,354, 557,395,341,300,233,586,287,206,125,644,563,183,536, 402,212,355,186,328,777,587, 397,302,207,112,673,345, 646,565,403,308,241,594,214,187,357,540,160,303,589, 332,647,552,41 8,785,228,595,405,310,215,650,120,569, 189,542,218,361,334,419,772,705,610,392,311,230,651,5 97,556,340,176,543,409,314,219,124,335,658,801,611,421, 774,231,584,450,369,653,558,396,342, 315,234,601,288, 221,126,659,564,184,775,613,451,356,559,425,343,778, 235,588,398,317,208,127, 674,346,661,566,404,242,833, 453,188,358,779,617,399,304,237,590,675,347,648,567, 433,786,24 3,596,406,216,665,359,570,190,781,591,457, 362,677,349,420,787,706,625,407,312,245,652,598,5 71,191,544,410,220,363,336,897,802,707,612,422,789,232, 681,599,465,370,654,573,411,316,249, 602,222,365,660, 803,423,776,709,614,452,371,655,560,426,344,793,236, 603,413,318,223,128,689, 662,805,615,481,834,454,427, 373,780,713,618,400,319,238,605,676,348,663,568,434, 244,835,45 5,666,360,809,619,429,782,239,592,458,377, 678,350,435,788,721,626,408,246,667,837,572,192,7 83,621,459,364,679,351,898,817,708,627,437,790,247,682, 600,466,669,574,412,250,841,461,366, 899,804,737,424, 791,710,683,629,467,372,656,575,441,794,251,604,414, 224,367,690,901,806,711, 616,482,849,685,469,428,374, 795,714,633,415,320,253,606,691,664,807,483,836,456, 905,375,81 0,715,620,430,797,240,607,473,378,693,436, 722,865,485,668,838,811,431,784,717,622,460,379,6 80,352,913,818,723,628,438,248,697,839,670,813,623,489, 842,462,381,900,819,738,439,792,725, 684,630,468,671, 576,442,252,843,463,368,929,739,902,821,712,631,497, 850,686,470,443,796,729, 634,416,254,845,692,903,808, 741,484,851,687,471,906,376,825,716,635,445,798,255, 608,474,69 4,961,866,486,907,853,812,745,432,799,718, 637,475,380,695,914,724,867,487,698,840,909,814,7 19,624,490,857,477,382,915,820,753,440,726,699,869,672, 815,491,844,464,383,930,740,917,822, 727,632,498,701, 444,730,873,493,846,931,904,823,742,499,852,688,472, 921,826,731,636,446,256, 847,933,743,962,881,501,908, 854,827,746,447,800,733,638,476,696,963,868,488,937, 855,747,91 0,829,720,639,505,858,478,916,754,965,700, 870,911,816,749,492,859,479,384,945,755,918,728,8 71,702,969,874,494,861,932,919,824,757,500,703,922,732, 875,495,848,934,744,977,882,502,923, 828,761,448,734, 877,935,964,883,503,938,856,748,925,830,735,640,506, 993,966,939,885,912,831, 750,507,860,480,946,756,967, 872,941,751,970,889,509,862,947,920,758,704,971,876, 496,863,94 9,759,978,924,762,973,878,936,979,884,504, 953,763,926,736,879,994,981,940,886,927,832,765,5 08,995,968,887,942,752,985,890,510,948,997,943,972,891, 511,864,950,760,1001,974,893,951,980, 954,764,975,880, 1009,982,955,928,766,996,983,888,957,767,986,998,944, 987,892,512,999,1002, 989,894,952,1003,976,895,1010, 956,1005,1011,984,958,768,1013,959,988,1000,1017,990, 1004,99 1,896,1006,1012,1007,1014,960,1015,1018,1019, 992,1021,1008,1016,1020,1022,1023,1024}; and performing, decoding on a to-be-decoded sequence based on the maximum mother code sequence.

According to an eleventh aspect, an embodiment of the present disclosure provides a sending device, configured to execute the method in any one of the first aspect or the possible implementations of the first aspect. Specifically, the sending device includes a unit that executes the method in any one of the first aspect or the possible implementations of the first aspect.

According to a twelfth aspect, an embodiment of the present disclosure provides a sending device, configured to execute the method in any one of the second aspect or the possible implementations of the second aspect. Specifically, the sending device includes a unit that executes the method in any one of the second aspect or the possible implementations of the second aspect.

According to a thirteenth aspect, an embodiment of the present disclosure provides a receiving device, configured to execute the method in any one of the third aspect or the possible implementations of the third aspect. Specifically, the receiving device includes a unit that executes the method in any one of the third aspect or the possible implementations of the third aspect.

According to a fourteenth aspect, an embodiment of the present disclosure provides a receiving device, configured to execute the method in any one of the fourth aspect or the possible implementations of the fourth aspect. Specifically, the receiving device includes a unit that executes the method in any one of the fourth aspect or the possible implementations of the fourth aspect.

According to a fifteenth aspect, an embodiment of the present disclosure provides a sending device, configured to execute the method in any one of the fifth aspect or the possible implementations of the fifth aspect. Specifically, the sending device includes a unit that executes the method in any one of the fifth aspect or the possible implementations of the fifth aspect.

According to a sixteenth aspect, an embodiment of the present disclosure provides a receiving device, configured to execute the method in any one of the sixth aspect or the possible implementations of the sixth aspect. Specifically, the receiving device includes a unit that executes the method in any one of the sixth aspect or the possible implementations of the sixth aspect.

According to a seventeenth aspect, an embodiment of the present disclosure provides a sending device, configured to execute the method in any one of the seventh aspect or the possible implementations of the seventh aspect. Specifically, the sending device includes a unit that executes the method in any one of the seventh aspect or the possible implementations of the seventh aspect.

According to an eighteenth aspect, an embodiment of the present disclosure provides a sending device, configured to execute the method in any one of the eighth aspect or the possible implementations of the eighth aspect. Specifically, the sending device includes a unit that executes the method in any one of the eighth aspect or the possible implementations of the eighth aspect.

According to a nineteenth aspect, an embodiment of the present disclosure provides a receiving device, configured to execute the method in any one of the ninth aspect or the possible implementations of the ninth aspect. Specifically, the receiving device includes a unit that executes the method in any one of the ninth aspect or the possible implementations of the ninth aspect.

According to a twentieth aspect, an embodiment of the present disclosure provides a receiving device, configured to execute the method in any one of the tenth aspect or the possible implementations of the tenth aspect. Specifically, the receiving device includes a unit that executes the method in any one of the tenth aspect or the possible implementations of the tenth aspect.

According to a twenty-first aspect, an embodiment of the present disclosure provides a coding apparatus. The coding apparatus has functions of implementing behavior of the sending device in any one of the first aspect or the possible designs of the first aspect. The functions may be implemented by hardware, or may be implemented by hardware executing corresponding software. The hardware or software includes one or more modules corresponding to the foregoing functions.

In a possible design, when some or all of the functions are implemented by hardware, the coding apparatus includes: an input interface circuit, configured to obtain a to-be-coded sequence; a logic circuit, configured to execute behavior of a transmit end in any one of the first aspect or the possible designs of the first aspect; and an output interface circuit, configured to output a polar-coded bit sequence.

In one embodiment, the coding apparatus may be a chip or an integrated circuit.

In a possible design, when some or all of the functions are implemented by software, the coding apparatus includes: a memory, configured to store a program; and a processor, configured to execute the program stored in the memory, and when the program is executed, the coding apparatus can implement the method in any one of the first aspect or the possible designs of the first aspect.

In one embodiment, the memory may be a physically independent unit, or may be integrated with the processor.

In a possible design, when some or all of the functions are implemented by software, the coding apparatus includes a processor. A memory configured to store a program is located outside the coding apparatus. The processor is connected to the memory through a circuit/wire, and is configured to read and execute the program stored in the memory.

According to a twenty-second aspect, an embodiment of the present disclosure provides a coding apparatus. The coding apparatus has functions of implementing behavior of the sending device in any one of the second aspect or the possible designs of the second aspect. The functions may be implemented by hardware, or may be implemented by hardware executing corresponding software. The hardware or software includes one or more modules corresponding to the foregoing functions.

In a possible design, when some or all of the functions are implemented by hardware, the coding apparatus includes: an input interface circuit, configured to obtain a to-be-coded sequence; a logic circuit, configured to execute behavior of a transmit end in any one of the second aspect or the possible designs of the second aspect; and an output interface circuit, configured to output a polar-coded bit sequence.

In one embodiment, the coding apparatus may be a chip or an integrated circuit.

In a possible design, when some or all of the functions are implemented by software, the coding apparatus includes: a memory, configured to store a program; and a processor, configured to execute the program stored in the memory, and when the program is executed, the coding apparatus can implement the method in any one of the second aspect or the possible designs of the second aspect.

In one embodiment, the memory may be a physically independent unit, or may be integrated with the processor.

In a possible design, when some or all of the functions are implemented by software, the coding apparatus includes a processor. A memory configured to store a program is located outside the coding apparatus. The processor is connected to the memory through a circuit/wire, and is configured to read and execute the program stored in the memory.

According to a twenty-third aspect, an embodiment of the present disclosure provides a decoding apparatus. The decoding apparatus has functions of implementing behavior of the receiving device in any one of the third aspect or the possible designs of the third aspect. The functions may be implemented by hardware, or may be implemented by hardware executing corresponding software. The hardware or software includes one or more modules corresponding to the foregoing functions.

In a possible design, when some or all of the functions are implemented by hardware, the decoding apparatus includes: an input interface circuit, configured to obtain a to-be-decoded sequence; a logic circuit, configured to execute behavior of the receiving device in any one of the third aspect or the possible designs of the third aspect; and an output interface circuit, configured to output a decoded bit sequence.

In one embodiment, the decoding apparatus may be a chip or an integrated circuit.

In a possible design, when some or all of the functions are implemented by software, the decoding apparatus includes: a memory, configured to store a program; and a processor, configured to execute the program stored in the memory, and when the program is executed, the decoding apparatus can implement the method in any one of the third aspect or the possible designs of the third aspect.

In one embodiment, the memory may be a physically independent unit, or may be integrated with the processor.

In a possible design, when some or all of the functions are implemented by software, the decoding apparatus includes a processor. A memory configured to store a program is located outside the coding apparatus. The processor is connected to the memory through a circuit/wire, and is configured to read and execute the program stored in the memory.

According to a twenty-fourth aspect, an embodiment of the present disclosure provides a decoding apparatus. The decoding apparatus has functions of implementing behavior of the receiving device in any one of the fourth aspect or the possible designs of the fourth aspect. The functions may be implemented by hardware, or may be implemented by hardware executing corresponding software. The hardware or software includes one or more modules corresponding to the foregoing functions.

In a possible design, when some or all of the functions are implemented by hardware, the decoding apparatus includes: an input interface circuit, configured to obtain a to-be-decoded sequence; a logic circuit, configured to execute behavior of the receiving device in any one of the fourth aspect or the possible designs of the fourth aspect; and an output interface circuit, configured to output a decoded bit sequence.

In one embodiment, the decoding apparatus may be a chip or an integrated circuit.

In a possible design, when some or all of the functions are implemented by software, the decoding apparatus includes: a memory, configured to store a program; and a processor, configured to execute the program stored in the memory, and when the program is executed, the decoding apparatus can implement the method in any one of the fourth aspect or the possible designs of the fourth aspect.

In one embodiment, the memory may be a physically independent unit, or may be integrated with the processor.

In a possible design, when some or all of the functions are implemented by software, the decoding apparatus includes a processor. A memory configured to store a program is located outside the coding apparatus. The processor is connected to the memory through a circuit/wire, and is configured to read and execute the program stored in the memory.

According to a twenty-fifth aspect, an embodiment of the present disclosure provides a coding apparatus. The coding apparatus has functions of implementing behavior of the sending device in any one of the fifth aspect or the possible designs of the fifth aspect. The functions may be implemented by hardware, or may be implemented by hardware executing corresponding software. The hardware or software includes one or more modules corresponding to the foregoing functions.

In a possible design, when some or all of the functions are implemented by hardware, the coding apparatus includes: an input interface circuit, configured to obtain a to-be-coded sequence; a logic circuit, configured to execute behavior of a transmit end in any one of the fifth aspect or the possible designs of the fifth aspect; and an output interface circuit, configured to output a polar-coded bit sequence.

In one embodiment, the coding apparatus may be a chip or an integrated circuit.

In a possible design, when some or all of the functions are implemented by software, the coding apparatus includes: a memory, configured to store a program; and a processor, configured to execute the program stored in the memory, and when the program is executed, the coding apparatus can implement the method in any one of the fifth aspect or the possible designs of the fifth aspect.

In one embodiment, the memory may be a physically independent unit, or may be integrated with the processor.

In a possible design, when some or all of the functions are implemented by software, the coding apparatus includes a processor. A memory configured to store a program is located outside the coding apparatus. The processor is connected to the memory through a circuit/wire, and is configured to read and execute the program stored in the memory.

According to a twenty-sixth aspect, an embodiment of the present disclosure provides a decoding apparatus. The decoding apparatus has functions of implementing behavior of the receiving device in any one of the sixth aspect or the possible designs of the sixth aspect. The functions may be implemented by hardware, or may be implemented by hardware executing corresponding software. The hardware or software includes one or more modules corresponding to the foregoing functions.

In a possible design, when some or all of the functions are implemented by hardware, the decoding apparatus includes: an input interface circuit, configured to obtain a to-be-decoded sequence; a logic circuit, configured to execute behavior of the receiving device in any one of the sixth aspect or the possible designs of the sixth aspect; and an output interface circuit, configured to output a decoded bit sequence.

In one embodiment, the decoding apparatus may be a chip or an integrated circuit.

In a possible design, when some or all of the functions are implemented by software, the decoding apparatus includes: a memory, configured to store a program; and a processor, configured to execute the program stored in the memory, and when the program is executed, the decoding apparatus can implement the method in any one of the sixth aspect or the possible designs of the sixth aspect.

In one embodiment, the memory may be a physically independent unit, or may be integrated with the processor.

In a possible design, when some or all of the functions are implemented by software, the decoding apparatus includes a processor. A memory configured to store a program is located outside the coding apparatus. The processor is connected to the memory through a circuit/wire, and is configured to read and execute the program stored in the memory.

According to a twenty-seventh aspect, an embodiment of the present disclosure provides a coding apparatus. The coding apparatus has functions of implementing behavior of the sending device in any one of the seventh aspect or the possible designs of the seventh aspect. The functions may be implemented by hardware, or may be implemented by hardware executing corresponding software. The hardware or software includes one or more modules corresponding to the foregoing functions.

In a possible design, when some or all of the functions are implemented by hardware, the coding apparatus includes: an input interface circuit, configured to obtain a to-be-coded sequence; a logic circuit, configured to execute behavior of a transmit end in any one of the seventh aspect or the possible designs of the seventh aspect; and an output interface circuit, configured to output a polar-coded bit sequence.

In one embodiment, the coding apparatus may be a chip or an integrated circuit.

In a possible design, when some or all of the functions are implemented by software, the coding apparatus includes: a memory, configured to store a program; and a processor, configured to execute the program stored in the memory, and when the program is executed, the coding apparatus can implement the method in any one of the seventh aspect or the possible designs of the seventh aspect.

In one embodiment, the memory may be a physically independent unit, or may be integrated with the processor.

In a possible design, when some or all of the functions are implemented by software, the coding apparatus includes a processor. A memory configured to store a program is located outside the coding apparatus. The processor is connected to the memory through a circuit/wire, and is configured to read and execute the program stored in the memory.

According to a twenty-eighth aspect, an embodiment of the present disclosure provides a coding apparatus. The coding apparatus has functions of implementing behavior of the sending device in any one of the eighth aspect or the possible designs of the eighth aspect. The functions may be implemented by hardware, or may be implemented by hardware executing corresponding software. The hardware or software includes one or more modules corresponding to the foregoing functions.

In a possible design, when some or all of the functions are implemented by hardware, the coding apparatus includes: an input interface circuit, configured to obtain a to-be-coded sequence; a logic circuit, configured to execute behavior of a transmit end in any one of the eighth aspect or the possible designs of the eighth aspect; and an output interface circuit, configured to output a polar-coded bit sequence.

In one embodiment, the coding apparatus may be a chip or an integrated circuit.

In a possible design, when some or all of the functions are implemented by software, the coding apparatus includes: a memory, configured to store a program; and a processor, configured to execute the program stored in the memory, and when the program is executed, the coding apparatus can implement the method in any one of the eighth aspect or the possible designs of the eighth aspect.

In one embodiment, the memory may be a physically independent unit, or may be integrated with the processor.

In a possible design, when some or all of the functions are implemented by software, the coding apparatus includes a processor. A memory configured to store a program is located outside the coding apparatus. The processor is connected to the memory through a circuit/wire, and is configured to read and execute the program stored in the memory.

According to a twenty-ninth aspect, an embodiment of the present disclosure provides a decoding apparatus. The decoding apparatus has functions of implementing behavior of the receiving device in any one of the ninth aspect or the possible designs of the ninth aspect. The functions may be implemented by hardware, or may be implemented by hardware executing corresponding software. The hardware or software includes one or more modules corresponding to the foregoing functions.

In a possible design, when some or all of the functions are implemented by hardware, the decoding apparatus includes: an input interface circuit, configured to obtain a to-be-decoded sequence; a logic circuit, configured to execute behavior of the receiving device in any one of the ninth aspect or the possible designs of the ninth aspect; and an output interface circuit, configured to output a decoded bit sequence.

In one embodiment, the decoding apparatus may be a chip or an integrated circuit.

In a possible design, when some or all of the functions are implemented by software, the decoding apparatus includes: a memory, configured to store a program; and a processor, configured to execute the program stored in the memory, and when the program is executed, the decoding apparatus can implement the method any one of in the ninth aspect or the possible designs of the ninth aspect.

In one embodiment, the memory may be a physically independent unit, or may be integrated with the processor.

In a possible design, when some or all of the functions are implemented by software, the decoding apparatus includes a processor. A memory configured to store a program is located outside the coding apparatus. The processor is connected to the memory through a circuit/wire, and is configured to read and execute the program stored in the memory.

According to a thirtieth aspect, an embodiment of the present disclosure provides a decoding apparatus. The decoding apparatus has functions of implementing behavior of the receiving device in any one of the tenth aspect or the possible designs of the tenth aspect. The functions may be implemented by hardware, or may be implemented by hardware executing corresponding software. The hardware or software includes one or more modules corresponding to the foregoing functions.

In a possible design, when some or all of the functions are implemented by hardware, the decoding apparatus includes: an input interface circuit, configured to obtain a to-be-decoded sequence; a logic circuit, configured to execute behavior of the receiving device in any one of the tenth aspect or the possible designs of the tenth aspect; and an output interface circuit, configured to output a decoded bit sequence.

In one embodiment, the decoding apparatus may be a chip or an integrated circuit.

In a possible design, when some or all of the functions are implemented by software, the decoding apparatus includes: a memory, configured to store a program; and a processor, configured to execute the program stored in the memory, and when the program is executed, the decoding apparatus can implement the method in any one of the tenth aspect or the possible designs of the tenth aspect.

In one embodiment, the memory may be a physically independent unit, or may be integrated with the processor.

In a possible design, when some or all of the functions are implemented by software, the decoding apparatus includes a processor. A memory configured to store a program is located outside the coding apparatus. The processor is connected to the memory through a circuit/wire, and is configured to read and execute the program stored in the memory.

According to a thirty-first aspect, an embodiment of the present disclosure provides a computer-readable storage medium. The computer-readable storage medium stores an instruction, and when the instruction is run on a computer, the computer is enabled to execute the method in any one of the first aspect or the possible implementations of the first aspect.

According to a thirty-second aspect, an embodiment of the present disclosure provides a computer-readable storage medium. The computer-readable storage medium stores an instruction, and when the instruction is run on a computer, the computer is enabled to execute the method in any one of the second aspect or the possible implementations of the second aspect.

According to a thirty-third aspect, an embodiment of the present disclosure provides a computer-readable storage medium. The computer-readable storage medium stores an instruction, and when the instruction is run on a computer, the computer is enabled to execute the method in any one of the third aspect or the possible implementations of the third aspect.

According to a thirty-fourth aspect, an embodiment of the present disclosure provides a computer-readable storage medium. The computer-readable storage medium stores an instruction, and when the instruction is run on a computer, the computer is enabled to execute the method in any one of the fourth aspect or the possible implementations of the fourth aspect.

According to a thirty-fifth aspect, an embodiment of the present disclosure provides a computer-readable storage medium. The computer-readable storage medium stores an instruction, and when the instruction is run on a computer, the computer is enabled to execute the method in any one of the fifth aspect or the possible implementations of the fifth aspect.

According to a thirty-sixth aspect, an embodiment of the present disclosure provides a computer-readable storage medium. The computer-readable storage medium stores an instruction, and when the instruction is run on a computer, the computer is enabled to execute the method in any one of the sixth aspect or the possible implementations of the sixth aspect.

According to a thirty-seventh aspect, an embodiment of the present disclosure provides a computer-readable storage medium. The computer-readable storage medium stores an instruction, and when the instruction is run on a computer, the computer is enabled to execute the method in any one of the seventh aspect or the possible implementations of the seventh aspect.

According to a thirty-eighth aspect, an embodiment of the present disclosure provides a computer-readable storage medium. The computer-readable storage medium stores an instruction, and when the instruction is run on a computer, the computer is enabled to execute the method in any one of the eighth aspect or the possible implementations of the eighth aspect.

According to a thirty-ninth aspect, an embodiment of the present disclosure provides a computer-readable storage medium. The computer-readable storage medium stores an instruction, and when the instruction is run on a computer, the computer is enabled to execute the method in any one of the ninth aspect or the possible implementations of the ninth aspect.

According to a fortieth aspect, an embodiment of the present disclosure provides a computer-readable storage medium. The computer-readable storage medium stores an instruction, and when the instruction is run on a computer, the computer is enabled to execute the method in any one of the tenth aspect or the possible implementations of the tenth aspect.

In the embodiments of the present disclosure, the sending device and the receiving device first determine the reference sequence number set, and then further determine, based on the determining condition that is set based on a factor such as the code weight, the quantity of information bits, or the mother code length that is of the polar code and that is related to polar code coding/decoding performance, whether to determine the reference sequence number set as the information-bit sequence number set used for polar code coding and decoding, or to use the adjusted reference sequence number set as the information-bit sequence number set. In a polar code coding-decoding process, the sending device and the receiving device determine the information-bit sequence number set by considering various factors that affect the coding/decoding performance. Therefore, the polar code coding/decoding performance can be improved.

DESCRIPTION OF EMBODIMENTS

The following describes in detail technical solutions provided in the present disclosure with reference to the accompanying drawings.

Figure 1:
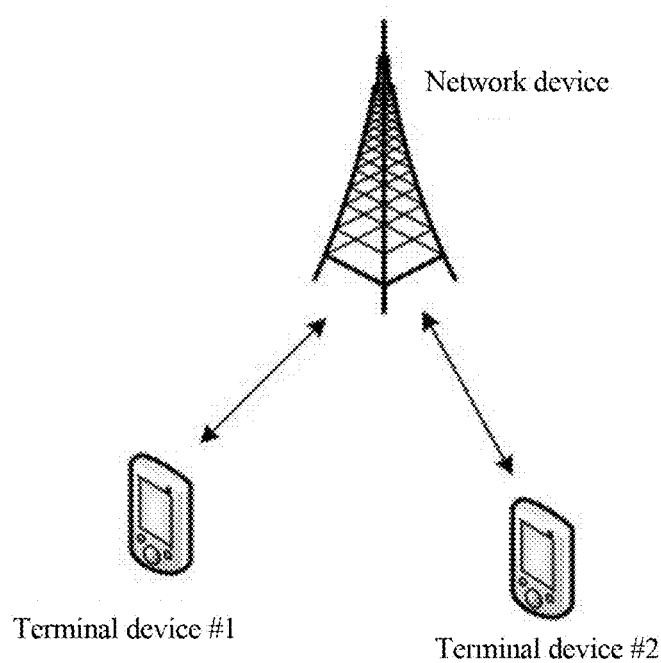
FIG. 1 shows a wireless communications system to which an embodiment of the present disclosure is applicable.

FIG. 1 shows a wireless communications system to which an embodiment of the present disclosure is applicable. The wireless communications system may include at least one network device. The network device communicates with one or more terminals. The network device may be a base station, or may be a device that integrates a base station and a base station controller, or may be another device having a similar communication function.

Terminals included in the embodiments of the present disclosure may include various handheld devices, vehicle-mounted devices, wearable devices, or computing devices that have a wireless communication function, or other processing devices connected to a wireless modem. The terminal may be a mobile station (MS), a subscriber unit, a cellular phone, a smartphone, a wireless data card, a personal digital assistant (PDA) computer, a tablet computer, a wireless modem, a handset, a laptop computer, a machine type communication (MTC) terminal, or the like.

The network device and the terminal in FIG. 1 communicate with each other by using a wireless technology. When the network device sends a signal, the network device is a transmit end. When the network device receives a signal, the network device is a receive end. This is the same for the terminal. When the terminal sends a signal, the terminal is a transmit end. When the terminal receives a signal, the terminal is a receive end.

Figure 2:
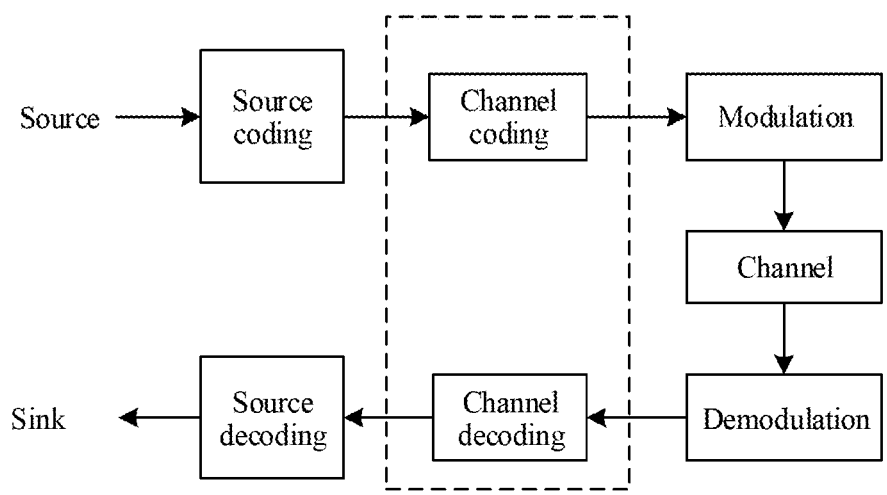
FIG. 2 is a basic flowchart of performing communication by using a radio technology.

FIG. 2 is a basic flowchart of performing communication by using a radio technology. A source of a transmit end successively undergoes source coding, channel coding, rate matching, and modulation, and then is sent on a channel. After a receive end receives a signal, the signal undergoes demodulation, rate dematching, channel decoding, and source decoding, to obtain a sink.

The wireless communications system in this embodiment of the present disclosure includes but is not limited to a narrowband internet of things (NB-IoT), a global system for mobile communications (GSM), an enhanced data rates for GSM evolution (EDGE) system, a wideband code division multiple access (WCDMA) system, a code division multiple access 2000 (CDMA2000) system, a time division-synchronous code division multiple access (TD-SCDMA) system, a long term evolution (LTE) system, three major application scenarios eMBB, URLLC, and eMTC in a next-generation 5G mobile communications system, or a new communications system in the future.

Channel coding and decoding is one of core technologies in the wireless communications field. An improvement to performance of channel coding and decoding directly increases network coverage and a user transmission rate. Currently, a polar code is a channel coding technology that achieves a Shannon capacity as theoretically proved and that has a coding/decoding capability with practical linear complexity. A core of polar code construction is as follows: "Channel polarization" processing and a coding method are used on a coding side, so that sub-channels present different reliabilities. When a code length constantly increases, some channels tend to be noise-free channels with a capacity close to 1 and the other channels tend to be pure noisy channels with a capacity close to 0. A channel with the capacity close to 1 is selected to directly transmit information, to reach the channel capacity as far as possible.

A polar code coding policy applies a characteristic of such a phenomenon, so that a noise-free channel is used to transmit useful information of a user and a pure noisy channel is used to transmit agreed information or no information. The polar code is a linear block code. A coding matrix (also referred to as a generation matrix) of the polar code is $F_N$, and a coding process is $x_1^N = \mu_1^N \cdot F_N$, $\mu_1^N = (\mu_1, \mu_2, \ldots \mu_N)$ is a binary row vector, a length is N (namely, a code length), and $N=2^n$, where n is a positive integer. F is an N×N matrix, and $F_N = F_2^{\otimes(\log_2 N)}$. $F_2^{\otimes(\log_2 N)}$ is defined as a Kronecker product of $\log 2^N$ matrices $F_2$, where $$F_2 = \begin{bmatrix} 1 & 0 \\ 1 & 1 \end{bmatrix}.$$

The addition and multiplication operations in the foregoing formulas are all addition and multiplication operations in a binary Galois field.

In a polar code coding process, some bits in $u_1^N$ are used to carry information, and are referred to as an information bit set. A set of indexes of these bits is denoted as A. Some other bits are set to fixed values that are pre-agreed on by the receive end and the transmit end, and are referred to as a fixed bit set or a frozen bit set. A set of indexes of these bits is represented by using a complementary set $A^c$ of A. The polar code coding process is equivalent to $x_1^N = \mu_A F_N(A) \oplus \mu_{A^c} F_N(A^c)$. $F_N(A)$ is a sub-matrix obtained by using rows corresponding to the indexes in the set A in $F_N$. $F_N(A^c)$ is a sub-matrix obtained by using rows corresponding to the indexes in the set $A^C$ in $F_N$. $u_A$ is an information bit set in $u_1^N$ and a quantity is K. $u_{A^c}$ is a fixed bit set in $u_1^N$, and includes known bits, and a quantity thereof is (N−K). These fixed bits are usually set to 0. However, the fixed bits may be set randomly, provided that a pre-agreement is reached by the receive end and the transmit end. Therefore, polar code coding output may be simplified into $x_1^N = \mu_A \cdot F_N(A)$. $u_A$ is an information bit set in $u_1^N$, $u_A$ is a row vector of the length K, that is, |A|=K, a symbol || represents a quantity of elements in the set, K is an information block size, $F_N(A)$ is the sub-matrix obtained by using the rows corresponding to the indexes in the set A in the matrix $F_N$, and $F_N(A)$ is an N×N matrix.

A polar code construction process is a selection process of the set A, and determines polar code performance. The polar code construction process is generally as follows: It is determined, based on a mother code length N that N polarized channels co-exist, where these N polarized channels are respectively corresponding to N rows in a coding matrix. Reliabilities of the polarized channels are calculated. Sequence numbers (or indexes) of first K polarized channels with higher reliabilities are used as elements in the set A, and sequence numbers corresponding to remaining (N−K) polarized channels are used as elements of the fixed bit sequence number set $A^C$. The set A determines a position of an information bit, and the set $A^C$ determines a position of a fixed bit. A polar code coding/decoding method provided in the embodiments of the present disclosure mainly relates to selection of an information-bit sequence number set. The following describes the polar code coding/decoding method provided in the embodiments of the present disclosure.

In the embodiments of the present disclosure, "first", "second", and the like are only used for distinguishing between different objects, for example, distinguishing between different sequence numbers, and should not be construed as a limitation on the protection scope of the embodiments of the present disclosure.

In addition, in the polar code coding process, one polar code includes the following parts: an information bit, a fixed bit (or referred to as a frozen bit), and a bit punctured in a rate matching process. For example, a mother code length of the polar code is N. Then, N=K+F+P. K is a quantity of information bits, F is a quantity of fixed bits, and P is a quantity of bits that are punctured in the rate matching process.

It should be noted that, in the embodiments of the present disclosure, the quantity K of information bits is a quantity of non-fixed bits. When a check bit exists in the coding process, K in this specification also includes a quantity of check bits.

Figure 3:
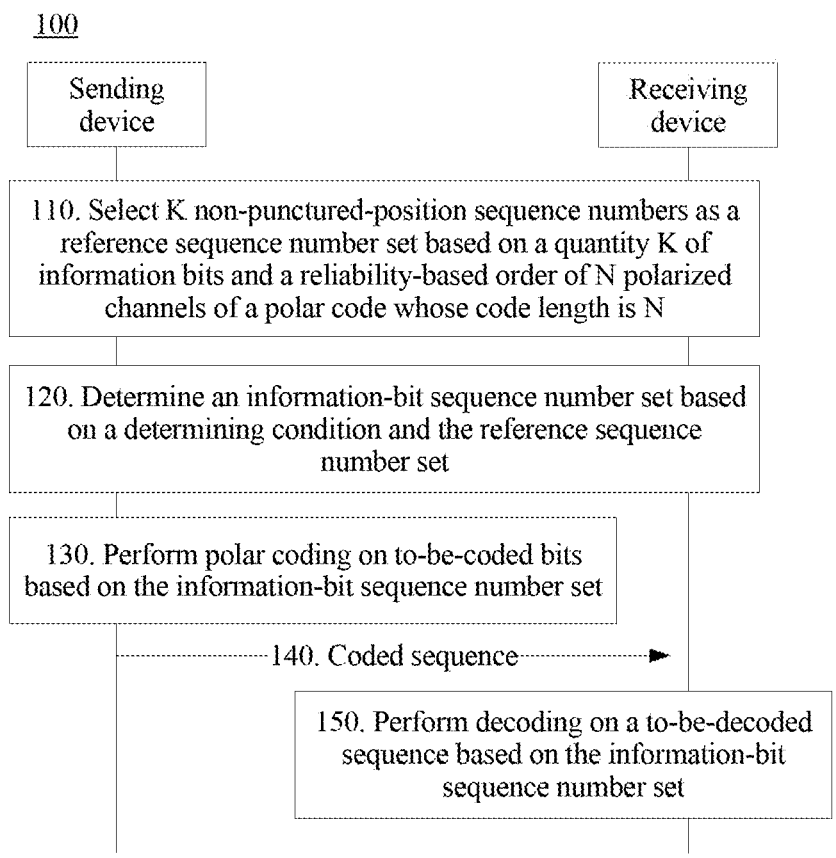
FIG. 3 is a schematic interaction diagram of a polar code coding/decoding method 100 according to an embodiment of the present disclosure.

FIG. 3 is a schematic interaction diagram of a polar code coding/decoding method 100 according to an embodiment of the present disclosure.

Operation 110. A sending device and a receiving device select K non-punctured-position sequence numbers as a reference sequence number set based on a quantity K of information bits and a reliability-based order of N polarized channels of a polar code whose code length is N.

A reliability of a polarized channel corresponding to any sequence number in the reference sequence number set is greater than reliabilities of polarized channels corresponding to remaining (N−K) sequence numbers, and K is greater than or equal to 1 and is an integer. Alternatively, a reliability of a polarized channel corresponding to any sequence number in the reference sequence number set is greater than or equal to a highest reliability in reliabilities of polarized channels corresponding to remaining (N−K) sequence numbers.

When the reliabilities of the polarized channels are calculated, a prior-art method such as density evolution, Gaussian approximation, or linear fitting may be used. A specific calculation process may be the same as that in the prior art. For brevity, details are not described.

In addition, a parameter such as an error probability, a channel capacity, or a polar weight may be selected as a parameter for measuring a polarized channel reliability, or another parameter that can measure the polarized channel reliability may be selected. This embodiment of the present disclosure sets no specific limitation thereto.

In this embodiment of the present disclosure, the reference sequence number set includes K sequence numbers, and the K sequence numbers are corresponding to K polarized channels in the N polarized channels. A reliability of any one of the K polarized channels is greater than or equal to a reliability of any one of the N polarized channels other than the K polarized channels.

For example, for a polar code whose code length N is equal 8, a sequence number of a polar signal ranges from 0 to 7. It is assumed that the reference sequence number set is {0,1,3,5}. For 8 polarized channels of the polar code with N=8, a reliability of a polarized channel corresponding to any one of sequence numbers 0, 1, 3, and 5 is greater than or equal to reliabilities of polarized channels corresponding to sequence numbers 2, 4, 6, and 7.

Herein, the reference sequence number set is used as a reference by the sending device to determine an information-bit sequence number set. The reference sequence number set may be used as the information-bit sequence number set used for polar coding. Alternatively, the sending device adjusts some or all sequence numbers in the reference sequence number set, and uses an adjusted reference sequence number set as the information-bit sequence number set. The following operation 120 describes in detail whether the reference sequence number set can be directly used as the information-bit sequence number set without adjustment.

Operation 120. The sending device and the receiving device determine an information-bit sequence number set based on a determining condition and the reference sequence number set.

The determining condition is set based on at least one of a code rate, a mother code length of the polar code, and a code weight.

Herein, the determining condition is used as a condition for the sending device and the receiving device to determine whether to directly use the reference sequence number set as the information-bit sequence number set used for polar coding. Alternatively, the determining condition is a condition for the sending device and the receiving device to determine, after selecting the reference sequence number set, whether to adjust the reference sequence number set.

The determining condition is preset by the sending device and the receiving device based on at least one of the polar coding code rate, the mother code length of the polar code, and the code weight.

It should be noted that, the code weight in this embodiment of the present disclosure is a quantity of "1s" in each row in a coding matrix $F_N$ of a polar code whose code length is N. Therefore, the code weight may also be referred to as a row weight or a Hamming weight. Sometimes, a row weight (or a code weight or a Hamming weight, not distinguished below) of a row may further be defined as a logarithm of a quantity of "1s" in this row. Without loss of generality, the quantity of "1s" in this row is used to define the row weight in the present disclosure. In addition, the row weight may also be calculated by using a polarized channel binary sequence number. It is assumed that a binary sequence number corresponding to a polarized channel sequence number i is $B_{n-1}B_{n-2} \ldots B_0$. A row weight corresponding to an $i^{th}$ row in the coding matrix or the channel sequence number i is $2^{\wedge}(B_{n-1}+B_{n-2}+ \ldots +B_0)$. For example, binary expressions of channel sequence numbers 0, 1, and 2 are respectively 00, 01, and 10, and corresponding row weight are respectively 1, 2, and 2.

Each row in a generation matrix $F_N$ of the polar code is corresponding to one row weight. In addition, a row weight is an integer power of 2. For example, the code weight is 2, 4, 16, 128, or the like.

For example, $$F_2 = \begin{bmatrix} 1 & 0 \\ 1 & 1 \end{bmatrix},$$

and $F_2$ includes two rows. A code weight of a first row is 1, and a code weight of a second row is 2.

For another example, $$F_4 = \begin{bmatrix} 1 & 0 & 0 & 0 \\ 1 & 0 & 1 & 0 \\ 1 & 1 & 0 & 0 \\ 1 & 1 & 1 & 1 \end{bmatrix},$$

$F_4$ includes four rows, and code weights are respectively 1, 2, 2, and 4.

In one embodiment, as an embodiment, the determining condition is at least one of the following conditions:

a mother code length is greater than or equal to a preset mother code length threshold;

a code rate is greater than or equal to a preset code rate threshold;

a quantity of minimum code weights in code weights corresponding to sequence numbers in the reference sequence number set is greater than or equal to a quantity threshold; and a minimum code weight in code weights corresponding to sequence numbers in the reference sequence number set is less than or equal to a preset code weight threshold.

It should be noted that, in this embodiment of the present disclosure, a code weight corresponding to a sequence number is a code weight (or a row weight) of a row corresponding to this sequence number in the generation matrix.

The sending device and the receiving device preset the determining condition as any one of the foregoing conditions, or a combination of any quantity of conditions in these conditions.

For example, that a code rate is greater than or equal to a preset code rate threshold is used as a condition #1, and that a mother code length is greater than or equal to a preset mother code length threshold is used as a condition #2.

The code rate threshold may be any one or more in {⅙, ⅓, ½, ⅔}. For example, different mother codes are corresponding to one or more code rate thresholds. The code length threshold may be any one of {64, 128, 256}.

The determining condition may be set to meet only the condition #1 or the condition #2. Alternatively, the determining condition meets both the condition #1 and the condition #2.

For another example, that a quantity of minimum code weights in code weights corresponding to sequence numbers in the reference sequence number set is greater than or equal to a quantity threshold (denoted as $K_t$ below) is denoted as a condition #3, and that a minimum code weight in code weights corresponding to sequence numbers in the reference sequence number set is less than or equal to a preset code weight threshold is denoted as a condition #4.

The quantity threshold may be any one or more of 1 to 25. Different mother codes may be corresponding to different quantity thresholds. For example, when the mother code length is 256, the corresponding quantity threshold $K_t$ is 5, 6, or 7. When the mother code length is 512, the corresponding quantity threshold $K_t$ is any one of 8, 9, 10, 11, and 12. When the mother code length is 1024, the corresponding quantity $K_c$ is any one of 8, 9, 10, 11, 12, 13, 14, and 15.

The code weight threshold is N/32 or any one of {N/16, N/32, N/64}, and N is the corresponding mother code length.

The preset mother code length threshold may be any one of {64, 128, 256}.

The determining condition may be preset to meet only the condition #3 or the condition #4. Alternatively, the determining condition may be preset to meet any quantity of conditions in the condition #1 to the condition #4.

In one embodiment, as an embodiment, when the determining condition is specifically that a minimum code weight in code weights corresponding to sequence numbers in the reference sequence number set is less than or equal to a preset code weight threshold, the method further includes:

calculating, by the sending device, code weights corresponding to all sequence numbers in the reference sequence number set; and determining, by the sending device, a minimum code weight in the code weights corresponding to all the sequence numbers in the reference sequence number set.

In other words, when the determining condition relates to the code weight threshold, before determining whether the determining condition is met, the sending device first needs to calculate code weights corresponding to sequence numbers of all polarized channels, and determine a minimum code weight in these code weights.

In one embodiment, as an embodiment, if the determining condition is not met, the sending device determines the reference sequence number set as the information-bit sequence number set.

In one embodiment, as an embodiment, if the determining condition is met, the sending device selects $K_1$ first sequence numbers from the reference sequence number set, where a code weight corresponding to each of the $K_1$ first sequence numbers is $W_{min}$, and $W_{min}$ is a minimum code weight in code weights corresponding to the K non-punctured-position sequence numbers; and the sending device selects $K_2$ second sequence numbers from available sequence numbers to replace $K_2$ first sequence numbers in the $K_1$ first sequence numbers, to obtain the information-bit sequence number set, where the available sequence numbers are sequence numbers in sequence numbers of the N polarized channels other than the reference sequence number set and a punctured-position sequence number, and $K_2 \leq K_1$, where the $K_2$ second sequence numbers meet at least one of the following conditions:

a code weight corresponding to each of the $K_2$ second sequence numbers is greater than $W_{min}$, and a reliability of a polarized channel corresponding to each second sequence number is greater than or equal to a reliability of a polarized channel corresponding to any one of a sequence number in the available sequence numbers other than the second sequence number and the punctured-position sequence number;

a minimum sequence number in the $K_2$ second sequence numbers is greater than a maximum sequence number in the available sequence numbers other than the $K_2$ second sequence numbers; and a code weight of each of the $K_2$ second sequence numbers is greater than or equal to $2W_{min}$.

It should be noted that, the sending device is merely used as an example for description in this embodiment. A process of determining the information-bit sequence number set based on the determining condition for the receiving device is the same as that for the sending device.

It should be understood that, the first sequence number herein is a sequence number corresponding to the minimum code weight (that is, $W_{min}$) in the reference sequence number set. The second sequence number is a sequence number that is selected from the N sequence numbers corresponding to the N polarized channels to replace the first sequence number in the reference sequence number set. Specifically, all or some of the $K_1$ first sequence numbers may be replaced. Therefore, a quantity of first sequence numbers is greater than or equal to a quantity of second sequence numbers, that is, $K_2 \leq K_1$.

For example, it is assumed that the reference sequence number set is {0, 1, 2, 3, 5, 4, 6, 7}. A set formed by eight code weights corresponding to the eight sequence numbers in the reference sequence number set is {1, 1, 1, 1, 2, 2, 4, 4}. Then, a minimum code weight $W_{min}$ in the plurality of code weights corresponding to all the sequence numbers in the reference sequence number set is equal to 1. In addition, four sequence numbers are corresponding to $W_{min}$, and are respectively sequence numbers 0, 1, 2, and 3. In this case, the quantity $K_1$ of first sequence numbers in the reference sequence number set is equal to 4.

For the sending device and the receiving device, in operation 110, the sending device determines the reference sequence number set based on the reliability-based order of the polarized channels. Subsequently, the sending device needs to determine whether polar coding parameters (for example, a code rate and a code weight corresponding to each sequence number in the reference sequence number set) meet the determining condition.

The following separately describes how to determine the information-bit sequence number set when the polar coding parameters meet or do not meet the determining condition (the two cases are denoted as a case 1 and a case 2 below).

Case 1

If the determining condition is not met, the sending device determines the reference sequence number set as the information-bit sequence number set. Subsequently, the sending device executes operation 130, that is, performs polar coding on to-be-coded bits based on the information-bit sequence number set.

Case 2

If the determining condition is met, the sending device adjusts the reference sequence number set, and uses an adjusted reference sequence number set as the information-bit sequence number set.

The following describes in detail a process in which the sending device adjusts the reference sequence number set to obtain the information-bit sequence number set when the determining condition is met.

For ease of description, a generation matrix of the polar code whose code length is N in operation 110 is denoted as $F_N$. It can be learned from a polar code coding process that, the generation matrix $F_N$ includes a total of N rows. Each row in the N rows has a code weight. Code weights of a $1^{st}$ row to an $N^{th}$ row in the generation matrix are denoted as $W_1, W_2, W_3, \ldots, W_N$ in sequence.

(1) The sending device determines the $K_1$ first sequence numbers in the reference sequence number set.

Code weights of rows corresponding to the $K_1$ first sequence numbers in the generation matrix are all less than a code weight of a row corresponding to another sequence number in the generation matrix.

In other words, it is assumed that the reference sequence number set includes a total of m sequence numbers. Code weights corresponding to the m sequence numbers are separately calculated, and m code weights are obtained. A minimum code weight in the m code weights is determined, and a sequence number corresponding to the minimum code weight is the first sequence number described herein. If there are a plurality of minimum code weights, sequence numbers corresponding to the plurality of minimum code weights are all the first sequence numbers described herein. A quantity of the minimum code weights is $K_1$, where $1 \leq K_1 \leq K$.

It should be understood that, $W_{min}$ is any one or more of $W_1, W_2, W_3, \ldots, W_N$.

In addition, as described above, a sequence number in the reference sequence number set is a non-punctured-position sequence number, and the $K_1$ first sequence numbers are selected from the reference sequence number set. Therefore, the $K_1$ first sequence numbers are non-punctured-position sequence numbers.

(2) The sending device selects the $K_2$ second sequence number from the available sequence numbers to replace the $K_2$ first sequence numbers in the $K_1$ first sequence numbers.

The available sequence numbers are remaining sequence numbers in the sequence numbers of the N polarized channels of the polar code whose code length is N in operation 110 other than the sequence numbers included in the reference sequence number set and the punctured-position sequence number.

It can be learned from the foregoing description that, a quantity of first sequence numbers that are replaced in the reference sequence number set is $K_2$. In this embodiment of the present disclosure, $K=\min(K_1, K_t)$.

$K_1$ represents the quantity of minimum code weights in the code weights corresponding to all the sequence numbers in the reference sequence number set. Alternatively, $K_1$ is a quantity of sequence numbers of polarized channels corresponding to the minimum code weight in the reference sequence number set. $K_1$ is a preset replacement quantity threshold.

In other words, if the polar code coding (for the sending device) parameters meet the determining condition, the reference sequence number set needs to be adjusted. In a specific adjustment process, some or all sequence numbers corresponding to the minimum code weight in the reference sequence number set are replaced. A quantity of replaced sequence numbers is denoted as $K_2$.

It can be learned from the foregoing $K_2$ calculation formula that, $K_2$ is related to the preset replacement quantity threshold and the quantity of minimum code weights in the code weights corresponding to all the sequence numbers in the reference sequence number set, and is a smaller one between the preset replacement quantity threshold and the quantity of minimum code weights in the code weights corresponding to all the sequence numbers in the reference sequence number set.

For example, for a polar code with K=4, if code weights corresponding to the 4 sequence numbers in the reference sequence number set is {1, 2, 2, 4}, $K_t$=2. Because $K_1$=1, $K_2=\min(1, 2)=1$ For another example, for a polar code with K=8, if code weights corresponding to the 8 sequence numbers in the reference sequence number set is {1, 1, 1, 1, 2, 2, 4, 4}, because $K_1$=4 and $K_1$=2, $K_2=\min(4, 2)=2$.

It can be understood that, when $K_t<K_1$, only some of the $K_1$ first sequence numbers in the reference sequence number set are replaced (to be specific, only $K_2$ sequence numbers are replaced and $K_2<K_1$). When $K_t \geq K_1$, all of the $K_1$ first sequence numbers may be replaced (to be specific, $K_2$ sequence numbers are replaced and $K_2=K_1$).

When only some of the $K_1$ first sequence numbers are replaced, $K_2$ first sequence numbers need to be selected from the $K_1$ first sequence numbers, to be replaced by second sequence numbers. The $K_2$ first sequence numbers may meet the following characteristics:

(1) A reliability of a polarized channel corresponding to any one of the $K_2$ first sequence numbers is less than or equal to a lowest reliability in reliabilities of $(K_1-K_2)$ polarized channels corresponding to remaining $(K_1-K_2)$ first sequence numbers.

(2) A maximum sequence number in the $K_2$ first sequence numbers is less than a minimum sequence number in the remaining $(K_1-K_2)$ first sequence numbers.

(3) The $K_2$ first sequence numbers may be randomly selected from the $K_1$ first sequence numbers.

The characteristics (1) to (3) herein are merely used as an example for selecting specific to-be-replaced first sequence numbers when some of the first sequence numbers are to be replaced. This embodiment of the present disclosure is not limited thereto.

How to determine a quantity of to-be-replaced first sequence numbers in the reference sequence number set is described herein. The following describes which sequence numbers are selected as second sequence numbers to replace the first sequence numbers.

Specifically, there are a plurality of manners of selecting the second sequence numbers.

Manner 1

The available sequence numbers are sorted in descending order of corresponding code weights, and an obtained sequence is denoted as a sequence #A.

First $K_2$ non-punctured-position sequence numbers of the sequence #A are selected as the $K_2$ second sequence numbers.

Manner 2

The available sequence numbers are sorted in descending order of the sequence numbers, and an obtained sequence is denoted as a sequence #B.

First $K_2$ non-punctured-position sequence numbers of the sequence #B are selected as the $K_2$ second sequence numbers.

Manner 3

$K_2$ sequence numbers whose code weight is greater than or equal to $2W_{min}$ are selected from N code weights corresponding to N sequence numbers as the $K_2$ second sequence numbers.

If there are $K_1$ first sequence numbers corresponding to $W_{min}$ in the reference sequence number set, when K ($K_2 \leq K_1$) first sequence numbers are to be replaced, the sending device first selects sequence numbers whose code weight is equal to $2W_{min}$ as the second sequence numbers. If there are $K_3$ sequence numbers corresponding to $2W_{min}$, and $K_3<K_2$, the sending device then selects ($K_2-K_3$) sequence numbers from sequence numbers whose corresponding code weight is equal to $4W_{min}$, and uses the ($K_2-K_3$) sequence numbers and the $K_3$ sequence numbers whose corresponding code weight is equal to $2W_{min}$ together as the $K_2$ second sequence numbers.

In other words, when selecting the second sequence numbers in the manner 3, the sending device first selects the sequence numbers whose corresponding code weight is equal to $2W_{min}$. In view of a size relationship between a quantity of sequence numbers whose corresponding code weight is equal to $2W_{min}$ and $K_1$, there may be two cases: (a) and (b).

(a) The quantity $K_3$ of sequence numbers corresponding to $2W_{min}$ is greater than or equal to $K_2$.

In this case, the $K_2$ second sequence numbers are selected from the sequence numbers whose corresponding code weight is equal to $2W_{min}$.

Further, if the quantity of sequence numbers corresponding to the code weight $2W_{min}$ is exactly $K_2$ ($K_3=K_2$), the $K_2$ sequence numbers corresponding to the code weight $2W_{min}$ are determined as the $K_2$ second sequence numbers. If the quantity of sequence numbers corresponding to the code weight $2W_{min}$ is greater than $K_2$ ($K_3>K_2$), $K_2$ sequence numbers are selected from $K_3$ sequence numbers corresponding to the code weight $2W_{min}$ as the second sequence numbers. For example, $K_2$ sequence numbers may be selected from sequence numbers corresponding to $2W_{min}$ in descending reliability-based order.

(b) The quantity $K_3$ of sequence numbers corresponding to $2W_{min}$ is less than $K_2$.

In this case, all (that is, $K_3$) sequence numbers corresponding to $2W_{min}$ are used as the second sequence numbers. In addition, ($K_2-K_3$) sequence numbers further need to be selected from sequence numbers corresponding to $4W_{min}$, and be used together with the $K_3$ sequence numbers corresponding to $2W_{min}$ as the $K_2$ second sequence numbers. By analogy, if a quantity of sequence numbers corresponding to $4W_{min}$ is less than ($K_2-K_3$), the sending device continues to select sequence numbers corresponding to $8W_{min}$, until a total quantity of selected sequence numbers is $K_2$. In other words, the sending device needs to select $K_2$ second sequence numbers in ascending order in a form of an integer power of 2.

It should be noted that, the foregoing manners are merely used as examples for selecting the second sequence numbers. In specific implementation, the selection is unnecessarily executed according to the selection operations one by one in this specification, provided that the selected $K_2$ second sequence numbers meet the condition in this specification that the $K_2$ second sequence numbers need to meet.

(3) A reference sequence number set obtained after $K_2$ first sequence numbers in the reference sequence number set are replaced by the $K_2$ second sequence numbers is used as the information-bit sequence number set.

At this point, the information-bit sequence number set used for polar coding is already determined. The sending device may perform polar coding on the to-be-coded bits based on the information-bit sequence number set. The receiving device may perform decoding on an obtained to-be-decoded sequence based on the information-bit sequence number set.

Operation 130. The sending device performs polar coding on to-be-coded bits based on the information-bit sequence number set.

Operation 140. The receiving device obtains a to-be-decoded sequence.

Operation 150. The receiving device performs decoding on the to-be-decoded sequence based on the information-bit sequence number set.

For polar coding and decoding processes in the foregoing operations 130 to 150, refer to the prior art. Details are not described herein.

In the foregoing method 100, before the sending device and the receiving device determine the reference sequence number set based on the reliability-based order of the polarized channels, and further determine the information-bit sequence number set based on the reference sequence number set, the sending device and the receiving device first need to obtain reliabilities of the N polarized channels of the polar code whose code length is N.

It can be learned from the foregoing description that, there are many parameters for measuring the reliabilities of the polarized channels. A polar weight may also be used as one of the parameters for measuring the reliabilities of the polarized channels. Therefore, in this embodiment of the present disclosure, the reliabilities of the polarized channels may be determined by calculating polar weights of the polarized channels.

In addition, this embodiment of the present disclosure sets no limitation on a method for calculating the polar weights of the polarized channels. For example, the sending device and the receiving device may use a prior-art method for calculating a polar weight of a polarized channel for calculation.

The prior art provides a polar weight calculation scheme. For a polar code whose code length is N ($N=2^n$, and n is greater than or equal to 1 and is an integer), a formula for calculating a polar weight of an $i^{th}$ polarized channel may be the following formula (1):

$$W_i = \sum_{j=0}^{n-1} B_j 2^{j\frac{1}{4}}, \quad (1)$$

where $B_j \in \{0,1\}$, $j \in \{0, 1, \ldots, n-1\}$, $i=B_{n-1}B_{n-2}\ldots B_0$, $B_{n-1}B_{n-2}\ldots B_0$ is a binary expression of i, $W_i$ is a polar weight of an $i^{th}$ polarized channel, and $i \in \{0, 1, \ldots, n-1\}$.

There is another method for calculating a polar weight of a polarized channel in the prior art, and the method is also applicable to this embodiment of the present disclosure. This embodiment of the present disclosure is not limited to using only the foregoing formula (1) for calculation.

In addition, an embodiment of the present disclosure provides a method for calculating a polar weight of a polarized channel (method 200 below), to improve polar code coding/decoding performance. The method for calculating a polar weight provided in this embodiment of the present disclosure may be used to measure a reliability of a polarized channel, to help improve accuracy of the reliability of the polarized channel, thereby further improving the polar code coding/decoding performance.

Figure 4:
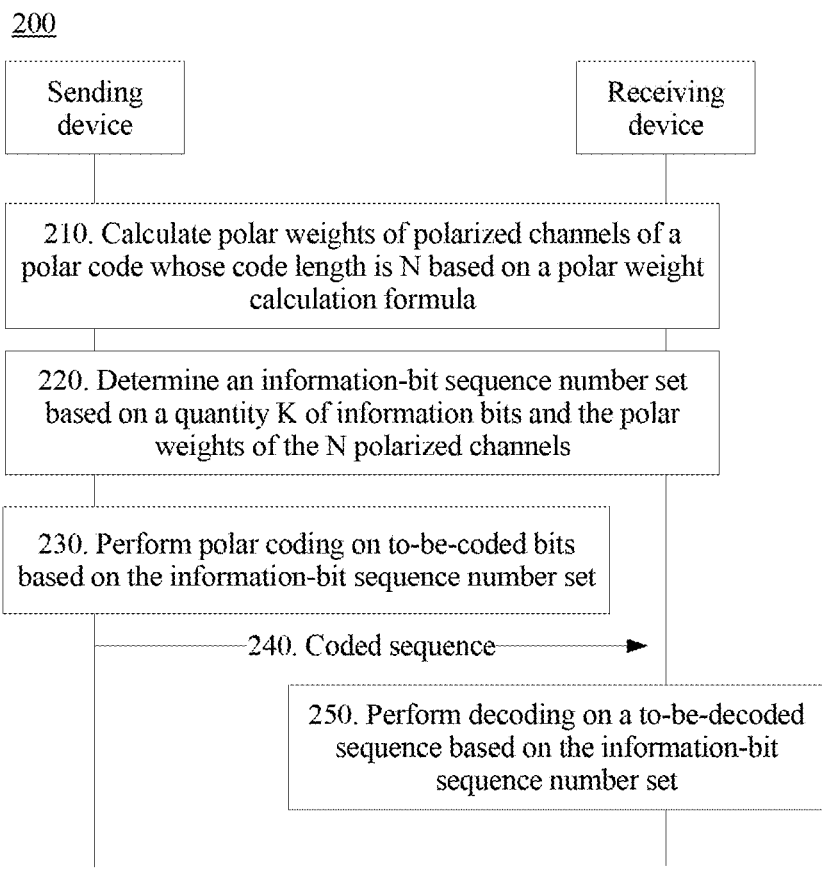
FIG. 4 is a schematic interaction diagram of a polar code coding/decoding method 200 according to another embodiment of the present disclosure.

FIG. 4 is a schematic interaction diagram of a polar code coding/decoding method 200 according to another embodiment of the present disclosure.

Operation 210. A sending device and a receiving device calculate polar weights of N polarized channels of a polar code whose code length is N based on a polar weight calculation formula.

The polar weight calculation formula is as follows:

$$W_i = \sum_{j=0}^{n-i} B_j \cdot a_1 \cdot [b_1 \cdot (2 \cdot c_1)^j + d_1]^{f_1} + \\ B_j \cdot a_2 \cdot [b_2 \cdot (2 \cdot c_2)^j + d_2]^{f_2} + (1 - B_j) \cdot a_3 \cdot [b_3 \cdot (2 \cdot c_3)^j + d_3]^{f_3} \quad (2)$$

$B_j \in \{0,1\}$, $j \in \{0, 1, \ldots, n-1\}$, $i=B_{n-1}B_{n-2}\ldots B_0$, $B_{n-1}B_{n-2}\ldots B_0$ is a binary expression of i, $W_i$ is a polar weight of an $i^{th}$ polarized channel, $i \in \{0, 1, \ldots, n-1\}$ a value range of each of $a_1$, $a_2$, $a_3$, $b_1$, $b_2$, $b_3$, $c_1$, $c_2$, $c_3$, $d_1$, $d_2$, $d_3$, $f_1$, $f_2$, and $f_3$ is $[-2, 2]$, and $n=\log_2(N)$.

Compared with the formula (1), the polar weight calculation formula (2) provided in this embodiment of the present disclosure features higher accuracy.

In one embodiment, in a possible implementation, a group of values of ($a_1$, $b_1$, $c_1$, $d_1$, $f_1$) in the formula (2) is (1, 1.07, 1, 0.5, ¼), (1, 1.1, 1, 0.5, 1, ¼), or (1, 1, 1, 0, ¼), and $a_2=a_3=0$.

In this case, the formula (2) may be simplified into the following formula (3):

$$W_i = \sum_{j=0}^{n-1} B_j \cdot a_1 \cdot [b_1 \cdot (2 \cdot c_1)^j + d_1]^{f_1} \quad (3)$$

One group of values of $a_1$, $b_1$, $c_1$, $d_1$, and $f_1$ may be substituted into the formula (3), and a polar weight of each polarized channel whose code length is N can be calculated.

In one embodiment, in a possible implementation, a group of values of $(a_1, b_1, c_1, d_1, f_1)$ in the formula (2) is (1, 1.07, 1, 0.5, ¼), (1, 1.1, 1, 0.5, 1, ¼), or (1, 1, 1, 0, ¼), a group of values of $(a_2, b_2, c_2, d_2, f_2)$ is (¼, 1, 1,0,¹⁄₁₆), and $a_3=0$.

In this case, the formula (2) may be simplified into the following formula (4):

$$W_i = \sum_{j=0}^{n-1} B_j \cdot a_1 \cdot [b_1 \cdot (2 \cdot c_1)^j + d_1]^{f_1} + B_j \cdot a_2 \cdot [b_2 \cdot (2 \cdot c_2)^j + d_2]^{f_2} \quad (4)$$

One group of values of $(a_1, b_1, c_1, d_1, f_1)$ and one group of values of $(a_2, b_2, c_2, d_2, f_2)$ may be substituted into the formula (4), and a polar weight of each polarized channel whose code length is N can be calculated.

In one embodiment, in another possible implementation, a group of values of $(a_3, b_3, c_3, d_3, f_3)$ in the formula (2) is (1, 1.2, 1, 0, 1), and $a_2=0$.

In this case, the formula (2) may be simplified into the following formula (5):

$$W_i = \sum_{j=0}^{n-1} B_j \cdot a_1 \cdot [b_1 \cdot (2 \cdot c_1)^j + d_1]^{f_1} + (1 - B_j) \cdot a_3 \cdot [b_3 \cdot (2 \cdot c_3)^j + d_3]^{f_3} \quad (5)$$

One group of values of $(a_1, b_1, c_1, d_1, f_1)$ and one group of values of $(a_3, b_3, c_3, d_3, f_3)$ may be substituted into the formula (5), and a polar weight of each polarized channel whose code length is N can be calculated.

In the following, when $(a_1, b_1, c_1, d_1, f_1)=(1, 1.07, 1, 0.5, ¼)$ and $a_2=a_3=0$, polar weights of all polarized channels are calculated based on the formula (3), and sequence numbers of the polarized channels are sorted in ascending order of the corresponding polar weights, to obtain a maximum mother code sequence, as shown in the following sequence #1. (Sorting of the current and following sequences starts from 1, which is equivalent to that starting from 0. When sorting starts from 0, each sequence number needs to be reduced by 1.)

The sequence #1 is equal to {1,2,3,5,9,17,4,33,6,7,10,65, 11,18,13,19,129,21,34,35,258,37,66,257,12,67,41, 69,20, 49,15,130,73,22,131,23,36,513,133,26,81,38,27,137,39, 258,29,68,42,97,259,43,145,70,261,5 0,16,71,45,74,51,265, 132,161,75,24,53,514,134,82,77,515,273,135,28,83,57,138, 40,193,517,30,85, 98,139,260,289,31,44,521,99,146,141, 89,262,147,72,46,101,263,52,529,47,266,149,321,162,76, 10 5,54,267,163,153,78,55,516,274,545,269,136,84,165,58, 113,79,275,194,518,59,385,86,140,195,16 9,519,277,290, 32,87,61,522,100,577,142,291,197,90,523,281,148,177, 102,143,91,264,293,530,48, 201,525,103,150,322,93,531, 106,268,151,323,297,164,641,107,154,56,209,533,546,270, 325,166,1 14,155,80,276,109,547,305,271, 167,60,386,537, 115,157,329,196,170,520,278,225,549,387,88,62,1 17,578, 171,279,292,198,769,63,524,389,282,579,337,553,178,144, 199,92,173,121,294,283,202,52 6,179,104,581,393,295,94, 532,203,561,527,285,152,324,298,181,353,642,95,108,585, 210,534,299, 205,643,401,326,156,211,185,535,110,548, 306,272,327,30,168,645,538,116,593,111,158,330,307, 213,226,550,388,539,417,118,159,331,172,280,649,227, 551,309,770,64,217,390,541, 19,580,338, 554,609,333,200, 771,174,229,122,391,284,339,555,313,180,657,582,175, 394,123,296,449,773,204, 562,528,286,233,583,341,557, 182,354,395,96,125,586,563,287,300,206,777,183,355,644, 402,673, 397,587,345,212,186,536,241,207,565,403,328, 302,357,646,594,187,112,589,308,214,785,303,647, 540, 405,418,595,569,160,332,215,189,361,650,228,552,310, 705,419,218,542,120,597,610,651,40 9,334,311,772,230, 801,219,392,543,340,556,421,314,611,369,658,335,176, 653,231,124,450,601,7 74,315,221,659,234,584,342,558, 396,613,451,425,775,126,564,288,235,343,559,317,778, 184,356, 661,833,674,398,127,588,453,346,617,242,208, 566,779,404,237,675,433,358,399,347,188,665,590, 243, 567,786,304,457,781,359,648,406,596,677,570,625,591, 349,216,787,190,362,245,706,407,42 0,571,897,598,191, 363,652,410,312,707,465,681,789,802,220,544,249,422, 599,573,612,370,411,3 36,365,654,232,803,709,602,423, 316,222,793,371,660,689,614,655,413,452,426,603,776, 481,805, 223,236,344,560,318,713,615,373,662,834,427, 128,454,605,618,319,780,663,835,238,809,676,434, 400, 455,348,429,619,377,666,244,568,721,239,458,782,435, 360,837,678,626,667,592,350,788,62 1,246,459,817,783, 408,679,572,437,898,627,351,192,364,669,841,247,708, 466,682,790,737,461,8 99,250,600,574,412,629,467,683, 441,791,366,804,710,251,424,575,901,794,372,849,690, 367,656, 414,711,604,469,685,482,633,806,224,795,253, 714,691,616,374,415,428,905,483,807,606,320,715, 473, 797,375,664,836,810,693,865,456,430,607,620,485,378, 722,240,811,717,436,913,838,431,37 9,668,723,697,622, 460,818,784,489,839,813,680,438,628,352,623,381,670, 842,248,819,725,738,4 62,439,900,929,630,671,843,468, 684,442,792,739,497,463,821,252,576,729,902,631,850, 443,368, 845,712,470,686,741,634,903,796,851,254,825, 692,416,471,687,445,906,484,635,808,961,255,716, 474, 798,376,745,853,694,866,907,608,486,637,475,799,812, 718,695,867,914,432,909,487,380,85 7,724,698,753,719, 477,915,490,840,814,869,699,624,382,820,726,491,815, 440,917,930,383,672,8 44,727,701,873,740,498,464,822, 493,931,730,632,444,921,846,499,823,742,731,904,852, 933,826, 881,847,472,688,446,743,636,501,962,256,827, 733,746,854,447,908,963,937,638,476,800,747,505, 855, 829,696,868,910,488,639,965,858,754,720,478,916,749, 945,870,911,859,700,755,479,492,81 6,969,871,918,384, 861,728,384702,8,87461,728,702,874,703,875,922,500, 824,977,495,732,761,934,8 82,923,848,877,744,502,935, 828,734,883,448,925,503,964,938,993,735,748,506,856, 830,885,939, 640,966,507,831,750,946,912,967,860,941, 889,756,480,751,509,970,947,872,862,758,971,920,949, 863,704,876,759,978,496,973,762,924,979,953,878,763, 936,884,879,926,504,981,994,736,765,88 6,927,940,995, 508,832,985,887,968,942,997,890,752,510,948,943,891, 511,972,1001,950,864,893, 760,974,951,980,954,1009,975, 764,955,880,982,766,928,983,957,996,767,986,888,998, 987,944,99 9,892,512,989,1002,894,1003,952,895,1010, 976,1005,956,1011,984,958,1013,768,959,988,1017,1 000, 990,991,1004,896,1006,1012,1007,1014,960,1015,1018, 1019,992,1021,1008,1016,1020,1022, 1023,1024}.

In the following, when $(a_1, b_1, c_1, d_1, f_1)=(1, 1, 1, 0, ¼)$, $(a_2, b_2, c_2, d_2, f_2)=(¼, 1, 1,0,¹⁄₁₆)$, and $a_3=0$, polar weights of all polarized channels are calculated based on the formula (4), and sequence numbers of the polarized channels are sorted in ascending order of the corresponding polar weights, to obtain a maximum mother code sequence, as shown in the following sequence #2.

The sequence #2 is equal to {1,2,3,5,9,17,4,33,6,7,10,65, 11,18,13,19,129,34,21,35,8,25,37,66,12,257,67,41,14,20, 69,15,130,49, 22,73,131,36,23,26,513,133,38,81,27,39,258, 68,137,42,29,259,97,70,43,16,145,50,261,71,45,74,13 2,51, 24,265,75,161,514,134,53,82,28,77,515,135,40,273,83,138, 57,30,517,260,193,98,139,85,44,3     1,146,289,99,262,72, 521,141,46,89,147,52,263,101,47,266,76,162,529,149,54, 321,267,105,78,163, 516,136,55,274,84,153,58,269,79,545, 165,518,275,194,113,140,86,59,32,519,385,290,195,100, 277,  169,87,522,142,61,90,148,291,577,264,197,102,523, 143,48,281,91,177,530,150,293,103,322,525, 268,201,106, 93,164,531,151,56,323,154,297,107,270,80,641,546,166, 533,276,209,114,155,325,60,     271,109,547,167,520,386, 305,196,115,278,170,88,537,157,62,329,549,387,292,225, 578,279,198,1 71,117,524,144,63,282,92,178,769,579,389, 294,199,104,553,337,173,526,283,202,121,94,179,532, 152,295,581,324,527,393,298,203,108,285,95,642,561,181, 534,210,353,156,326,299,585,272,205,     110,643,548,168, 535,401,306,211,116,185,327,538,158,301,111,330,645, 550,388,307,226,593,280,     213,172,118,539,159,64,331, 551,417,770,227,580,390,309,200,649,119,554,338,174, 541,284,217,     122,333,180,771,609,391,296,229,582,555, 339,175,528,394,313,204,123,286,96,657,562,182,773, 583,449,354,557,395,341,300,233,586,287,206,125,644, 563,183,536,402,212,355,186,328,777,587,     397,302,207, 112,673,345,646,565,403,308,241,594,214,187,357,540, 160,303,589,332,647,552,41   8,785,228,595,405,310,215, 650,120,569,189,542,218,361,334,419,772,705,610,392, 311,230,651,5     97,556,340,176,543,409,314,219,124,335, 658,801,611,421,774,231,584,450,369,653,558,396,342, 315,234,601,288,221,126,659,564,184,775,613,451,356, 559,425,343,778,235,588,398,317,208,127,     674,346,661, 566,404,242,833,453,188,358,779,617,399,304,237,590, 675,347,648,567,433,786,24   3,596,406,216,665,359,570, 190,781,591,457,362,677,349,420,787,706,625,407,312, 245,652,598,5     71,191,544,410,220,363,336,897,802,707, 612,422,789,232,681,599,465,370,654,573,411,316,249, 602,222,365,660,803,423,776,709,614,452,371,655,560, 426,344,793,236,603,413,318,223,128,689,     662,805,615, 481,834,454,427,373,780,713,618,400,319,238,605,676, 348,663,568,434,244,835,45   5,666,360,809,619,429,782, 239,592,458,377,678,350,435,788,721,626,408,246,667, 837,572,192,7     83,621,459,364,679,351,898,817,708,627, 437,790,247,682,600,466,669,574,412,250,841,461,366, 899,804,737,424,791,710,683,629,467,372,656,575,441, 794,251,604,414,224,367,690,901,806,711,     616,482,849, 685,469,428,374,795,714,633,415,320,253,606,691,664, 807,483,836,456,905,375,81   0,715,620,430,797,240,607, 473,378,693,436,722,865,485,668,838,811,431,784,717, 622,460,379,6   80,352,913,818,723,628,438,248,697,839, 670,813,623,489,842,462,381,900,819,738,439,792,725, 684,630,468,671,576,442,252,843,463,368,929,739,902, 821,712,631,497,850,686,470,443,796,729,     634,416,254, 845,692,903,808,741,484,851,687,471,906,376,825,716, 635,445,798,255,608,474,69   4,961,866,486,907,853,812, 745,432,799,718,637,475,380,695,914,724,867,487,698, 840,909,814,7   19,624,490,857,477,382,915,820,753,440, 726,699,869,672,815,491,844,464,383,930,740,917,822, 727,632,498,701,444,730,873,493,846,931,904,823,742, 499,852,688,472,921,826,731,636,446,256,     847,933,743, 962,881,501,908,854,827,746,447,800,733,638,476,696, 963,868,488,937,855,747,91   0,829,720,639,505,858,478, 916,754,965,700,870,911,816,749,492,859,479,384,945, 755,918,728,8     71,702,969,874,494,861,932,919,824,757, 500,703,922,732,875,495,848,934,744,977,882,502,923, 828,761,448,734,877,935,964,883,503,938,856,748,925, 830,735,640,506,993,966,939,885,912,831,     750,507,860, 480,946,756,967,872,941,751,970,889,509,862,947,920, 758,704,971,876,496,863,94   9,759,978,924,762,973,878, 936,979,884,504,953,763,926,736,879,994,981,940,886, 927,832,765,5     08,995,968,887,942,752,985,890,510,948, 997,943,972,891,511,864,950,760,1001,974,893,951,980, 954,764,975,880,1009,982,955,928,766,996,983,888,957, 767,986,998,944,987,892,512,999,1002, 989,894,952,1003, 976,895,1010,956,1005,1011,984,958,768,1013,959,988, 1000,1017,990,1004,99   1,896,1006,1012,1007,1014,960, 1015,1018,1019,992,1021,1008,1016,1020,1022,1023, 1024}.

During polar coding, the sending device may perform online calculation based on the polar coding method provided in the foregoing embodiments, to determine a mother code sequence of a required length. Alternatively, the sending device may pre-store the sequence #1 and the sequence #2 as the maximum mother code sequences. During polar coding, the mother code sequence of a required length is read from the sequence #1 or the sequence #2.

During polar decoding, the receiving device performs online calculation, to determine a mother code sequence of a required length. Alternatively, the receiving device may pre-store the sequence #1 and the sequence #2 as the maximum mother code sequences. During decoding on a to-be-decoded sequence, the mother code sequence of a required length is read from the sequence #1 or the sequence #2.

It should be understood that, code lengths of the sequence #1 and the sequence #2 are both 1024. Therefore, when a length (an integer power of 2) of a mother code sequence required by the sending device or the receiving device is less than or equal to 1024, a mother code sequence of the required length may be read from the sequence #1 or the sequence #2. Subsequently, the read mother code sequence is used for polar coding (for the sending device) or polar decoding (for the receiving device).

For a process of reading a mother code sequence of a required length from a maximum mother code sequence, refer to the prior art. Details are not described.

After the polar weights of all the polarized channels are calculated according to the formulas (2) to (5), the polar weights are used for measuring reliabilities of the polarized channels, to determine a reliability-based order of the polarized channels. Subsequently, a prior-art method or the method for determining an information-bit sequence number set previously described in the method 100 may be used for a process in which the sending device and the receiving device determine an information-bit sequence number set based on the reliability-based order of the polarized channels.

Operation 220. The sending device and the receiving device determine an information-bit sequence number set based on a quantity K of information bits and the polar weights of the N polarized channels.

In this embodiment of the present disclosure, the sending device and the receiving device use a polar weight as a parameter for measuring a reliability of a polarized channel. Therefore, it can be understood that, in operation 210, the sending device and the receiving device can calculate the polar weights of all polarized channels whose code length is N based on a polar weight calculation formula provided in this embodiment of the present disclosure, so that the reliability-based order of the N polarized channels can be determined.

In operation 220, the sending device and the receiving device select K non-punctured-position sequence numbers from sequence numbers corresponding to the polar weights of the N polarized channels based on the quantity K of information bits as the information-bit sequence number set. A polar weight corresponding to each of the K non-punctured-position sequence numbers is greater than or equal to a maximum polar weight in polar weights corresponding to remaining (N−K) sequence numbers.

In other words, after determining the polar weights of all of the N polarized channels, the sending device and the receiving device select non-punctured-position sequence numbers corresponding to K polar weights that are maximum polar weights in the N polar weights as the information-bit sequence number set.

Operation 230. The sending device performs polar coding on to-be-coded bits based on the information-bit sequence number set.

Operation 240. The receiving device obtains a to-be-decoded sequence.

Operation 250. The receiving device performs decoding on the to-be-decoded sequence based on the information-bit sequence number set.

Operations 230 to 250 are the same as the prior art, and details are not described herein again.

An experiment shows that, the formulas (2) to (4) for calculating a polar weight of a polarized channel provided in the embodiments of the present disclosure features higher accuracy than that of a polar weight of a polarized channel calculated by using the formula (2) in the prior art.

In addition, an embodiment of the present disclosure further provides another polar weight calculation method. Specifically, a polar weight of each polarized channel may be calculated according to the following formula (6):

$$W_i = \left( \sum_{j=0}^{n-1} B_j \cdot \beta^j + \sum_{m \in \Xi} \frac{1}{2^m} \cdot B_j \times \beta^{\frac{1}{2^m} j} \right) \quad (6)$$

$W_i$ is a polar weight of an $i^{th}$ polarized channel, $B_j \in \{0,1\}$, $j \in \{0, 1, \ldots, n-1\}$, $i \in \{0, 1, \ldots, n-1\}$, $i = B_{n-1} B_{n-2} \ldots B_0$, $B_{n-1} B_{n-2} \ldots B_0$ is a binary expression of i, and $\Xi = [1, 2, 3, \ldots]$ represents a value set of m, that is, m may be equal to any number in a set $\{1, 2, 3, \ldots\}$, $\beta = 2^{1/4}$, and $n = \log_2(N)$.

For example, when $\Xi = [2]$, the formula (6) may be converted into the following formula (7):

$$W_i = \left( \sum_{j=0}^{n-1} \beta^j + \frac{1}{4} \beta^{\frac{1}{4} j} \right) \quad (7)$$

According to the polar weight calculation method provided in the formula (6) or (7), a high-order term may be introduced to estimate a reliability of a polarized channel, so that a polar weight obtained through calculation according to the formula (6) or (7) features higher polarized channel reliability estimation accuracy. Compared with the foregoing polar weight method provided in the formula (1) in the prior art, during information transmission in a case with or without rate matching, the formulas (6) and (7) can reduce a signal-to-noise condition required for obtaining specified decoding performance. Therefore, polar code coding/decoding performance can be improved.

Herein, after the polar weights of all the polarized channels are calculated according to the formula (6), the polar weights are used for measuring the reliabilities of the polarized channels, to determine the reliability-based order of the polarized channels. Subsequently, a prior-art method or the method for determining an information-bit sequence number set previously described in the method 100 may be used for a process in which the sending device and the receiving device determine an information-bit sequence number set based on the reliability-based order of the polarized channels. This embodiment of the present disclosure sets no limitation thereto.

Further, in this embodiment of the present disclosure, after the polar weights of the polarized channels are obtained by using the foregoing various methods or any known method, the polar weights are further corrected based on row weights of all the polarized channels, to improve the polar code coding/decoding performance. Specifically, a corrected polar weight calculation formula is as follows:

W_Modified(j)=α*W(j)/max(W)+(1−α)*RW(j)/max (RW)

PW_Modified(j) is a corrected polar weight of a $j^{th}$ polarized channel, where $j = 0, 1, 2, \ldots, N-1$, a is a weighting coefficient, a is a positive constant greater than or equal to 0 and less than or equal to 1, for example, any value from 0.8-1, max(W) is a maximum polar weight value of a polarized channel, RW(j) is a row weight corresponding to the $j^{th}$ polarized channel, and max(RW) is a maximum row weight value of a polarized channel. It is easy to figure out that, a larger value of a indicates that a corrected polar weight more tends to be a polar weight; and a smaller value of a indicates that a corrected polar weight more tends to be a row weight.

It can be understood that, a process in which the receiving device performs decoding on the obtained to-be-decoded sequence is actually an inverse process in which the sending device performs polar coding on the to-be-coded bits based on the information-bit sequence number set. Because fixed bits are pre-agreed on by the sending device and the receiving device, and are known. Therefore, a key for the process in which the receiving device performs decoding on the to-be-decoded sequence is determining the information-bit sequence number set.

A process in which the receiving device determines the information-bit sequence number set is the same as a process in which the sending device determines the information-bit sequence number set. In other words, the receiving device first determines the reference sequence number set based on the quantity K of information bits and the reliability-based order of the N polarized channels of a polar code whose code length is N, and then determines the information-bit sequence number set based on a determining condition and the reference sequence number set.

The sending device and the receiving device pre-agree on the determining condition. For a polar code whose code length is N, processes of determining the information-bit sequence number set are the same in both coding and decoding. Therefore, a process in which the receiving device determines the information-bit sequence number set based on the determining condition and the reference sequence number set is the same as a process in which the sending device determines the information-bit sequence number set based on the determining condition and the reference sequence number set. Therefore, the process in which the receiving device determines the information-bit sequence number set is not repeatedly described in this specification. For details, refer to the process in which the sending device determines the information-bit sequence number set.

The foregoing describes in detail the polar code coding/decoding method provided in the embodiments of the present disclosure. It can be understood that, an online calculation manner or a table reading manner may be used in the polar code coding/decoding method in the foregoing embodiments. Alternatively, a manner of combining online calculation manner and table reading may be used. Specific implementation processes of online calculation and table reading are readily figured out by a person skilled in the art. Therefore, details are not described herein.

Figure 5:
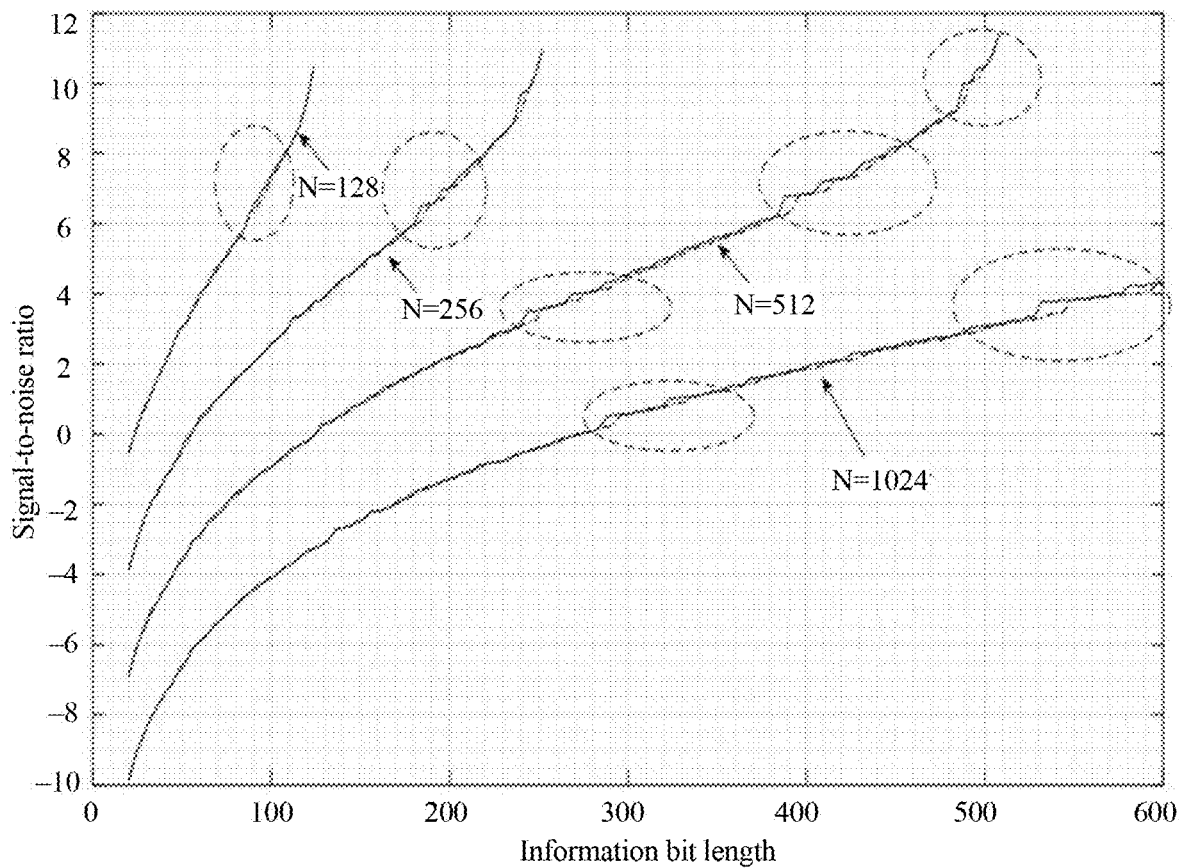
FIG. 5 is a diagram of polar code coding/decoding performance comparison between cases of different mother codes and different information bit lengths.

FIG. 5 is a diagram of polar code coding/decoding performance comparison between cases of different mother codes and different information bit lengths. Referring to FIG. 5, a horizontal coordinate in FIG. 5 indicates an information bit length and a vertical coordinate in FIG. 5 is a signal-to-noise ratio. There are four groups of lines in the figure (each group has one solid line and one dashed line), indicating that: When mother code lengths are respectively 1024, 512, 256, and 128, with different information bit lengths, a smaller value of a signal-to-noise ratio required for a packet error rate to reach 0.001 indicates better decoding performance. The solid line in FIG. 5 is a curve of a signal-to-noise ratio condition required for obtaining specified coding/decoding performance by using the prior-art formula (1). The dashed line is a curve of a signal-to-noise ratio condition required for obtaining specified coding/decoding performance by using the polar code coding/decoding method provided in the embodiments of the present disclosure. It can be learned from an experiment result that, for a same mother code length, a signal-to-noise ratio corresponding to the dashed line is lower than (positions in dashed-line circles) or equal to a signal-to-noise ratio corresponding to the solid line. It can be learned that, compared with the prior art, in the embodiments of the present disclosure, the polar code coding/decoding method improves the polar code coding/decoding performance.

In the embodiments of the present disclosure, the sending device and the receiving device first determine the reference sequence number set, and then further determine, based on the determining condition that is set based on a factor such as the code weight, the quantity of information bit sequence numbers, or the mother code length that is of the polar code and that is related to polar code coding/decoding performance, whether to determine the reference sequence number set as the information-bit sequence number set used for polar code coding and decoding, or to use the adjusted reference sequence number set as the information-bit sequence number set, so as to improve the polar code coding/decoding performance.

The foregoing describes in detail the polar code coding/decoding methods 100 and 200 provided in the embodiments of the present disclosure with reference to FIG. 3 to FIG. 5. The following describes a sending device and a receiving device provided in the embodiments of the present disclosure with reference to FIG. 6 to FIG. 16.

Figure 6:
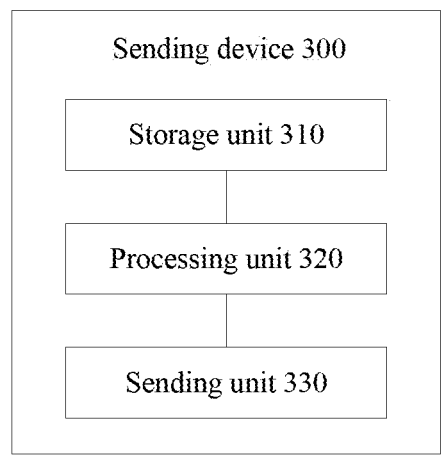
FIG. 6 is a schematic block diagram of a sending device 300 according to an embodiment of the present disclosure.

FIG. 6 is a schematic block diagram of a sending device 300 according to an embodiment of the present disclosure. Referring to FIG. 6, the sending device 300 includes a processing unit 310 and a sending unit 320, to execute the polar code coding method in the embodiments.

The processing unit 310 is configured to select K non-punctured-position sequence numbers as a reference sequence number set based on a quantity K of information bits and a reliability-based order of N polarized channels of a polar code whose code length is N, where a reliability of a polarized channel corresponding to any sequence number in the reference sequence number set is greater than or equal to a highest reliability in reliabilities of polarized channels corresponding to remaining (N−K) sequence numbers, and K is greater than or equal to 1 and is an integer; where the processing unit 310 is further configured to determine an information-bit sequence number set based on a determining condition and the reference sequence number set, where the determining condition is set based on at least one of a code rate, a mother code length of the polar code, and a code weight; and the processing unit 310 is further configured to perform polar coding on to-be-coded bits based on the information-bit sequence number set.

Alternatively, the processing unit 310 is configured to:

calculate polar weights of N polarized channels of a polar code whose code length is N based on a polar weight calculation formula, where the polar weight calculation formula is as follows:

$$W_i = \sum_{j=0}^{n-1} B_j \cdot a_1 \cdot [b_1 \cdot (2 \cdot c_1)^j + d_1]^{f_1} +$$
$$B_j \cdot a_2 \cdot [b_2 \cdot (2 \cdot c_2)^j + d_2]^{f_2} + (1 - B_j) \cdot a_3 \cdot [b_3 \cdot (2 \cdot c_3)^j + d_3]^{f_3},$$

where $W_i$ is a polar weight of an $i^{th}$ polarized channel, $i \in \{0, 1, \ldots, n-1\}$, $j \in \{0, 1, \ldots, n-1\}$, $B_j \in \{0,1\}$, $i = B_{n-1} B_{n-2} \ldots B_0$, $B_{n-1} B_{n-2} \ldots B_0$ is a binary expression of i, and a value range of each of $a_1$, $a_2$, $a_3$, $b_1$, $b_2$, $b_3$, $c_1$, $c_2$, $c_3$, $d_1$, $d_2$, $d_3$, $f_1$, $f_2$, and $f_3$ is $[-2, 2]$;

determine an information-bit sequence number set based on a quantity K of information bits and the polar weights of the N polarized channels; and perform polar coding on to-be-coded bits based on the information-bit sequence number set.

Alternatively, the processing unit 310 is configured to:

calculate a polar weight of each of N polarized channels of a polar code whose code length is N based on a polar weight calculation formula:

$$W_i = \left( \sum_{j=0}^{n-1} B_j \cdot \beta^j + \sum_{m \in E} \frac{1}{2^m} \cdot B_j \times \beta^{\frac{1}{2^m} j} \right),$$

where $W_i$ represents a polar weight of an $i^{th}$ polarized channel, and $i \leq N$;

determine an information-bit sequence number set based on a quantity K of information bits and the polar weights of the N polarized channels; and perform polar coding on to-be-coded bits based on the information-bit sequence number set.

Alternatively, the processing unit 310 is configured to:

determine a maximum mother code sequence, where the maximum mother code sequence is the foregoing sequence #1; and perform polar coding on a to-be-coded sequence based on the maximum mother code sequence.

Alternatively, the processing unit 310 is configured to:

determine a maximum mother code sequence, where the maximum mother code sequence is the foregoing sequence #2; and perform polar coding on a to-be-coded sequence based on the maximum mother code sequence.

Figure 7:
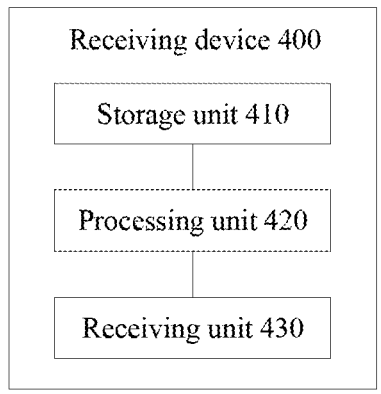
FIG. 7 is a schematic block diagram of a receiving device 400 according to an embodiment of the present disclosure.

FIG. 7 is a schematic block diagram of a receiving device 400 according to an embodiment of the present disclosure. Referring to FIG. 7, the receiving device 400 includes a processing unit 410 and a receiving unit 420, to execute the polar code decoding method in the foregoing embodiments.

The processing unit 410 is configured to select K non-punctured-position sequence numbers as a reference sequence number set based on a quantity K of information bits and a reliability-based order of N polarized channels of a polar code whose code length is N, where a reliability of a polarized channel corresponding to any sequence number in the reference sequence number set is greater than or equal to a highest reliability in reliabilities of polarized channels corresponding to remaining (N−K) sequence numbers, and K is greater than or equal to 1 and is an integer; where the processing unit 410 is further configured to determine an information-bit sequence number set based on a determining condition and the reference sequence number set, where the determining condition is set based on at least one of a code rate, a mother code length of the polar code, and a code weight; and the processing unit 410 is further configured to perform decoding on a to-be-decoded sequence based on the information-bit sequence number set.

Alternatively, the processing unit 410 is configured to:

calculate polar weights of N polarized channels of a polar code whose code length is N based on a polar weight calculation formula, where the polar weight calculation formula is as follows:

$$W_i = \sum_{j=0}^{n-1} B_j \cdot a_1 \cdot [b_1 \cdot (2 \cdot c_1)^j + d_1]^{f_1} +$$

$$B_j \cdot a_2 \cdot [b_2 \cdot (2 \cdot c_2)^j + d_2]^{f_2} + (1 - B_j) \cdot a_3 \cdot [b_3 \cdot (2 \cdot c_3)^j + d_3]^{f_3},$$

where $W_i$ is a polar weight of an $i^{th}$ polarized channel, $i \in \{0, 1, \ldots, n-1\}$, $j \in \{0, 1, \ldots, n-1\}$, $B_j \in \{0,1\}$, $i = B_{n-1}B_{n-2} \ldots B_0$, $B_{n-1}B_{n-2} \ldots B_0$ is a binary expression of i, and a value range of each of $a_1$, $a_2$, $a_3$, $b_1$, $b_2$, $b_3$, $c_1$, $c_2$, $c_3$, $d_1$, $d_2$, $d_3$, $f_1$, $f_2$, and $f_3$ is [−2, 2];

determine an information-bit sequence number set based on a quantity K of information bits and the polar weights of the N polarized channels; and perform decoding on a to-be-decoded sequence based on the information-bit sequence number set.

Alternatively, the processing unit 410 is configured to:

calculate a polar weight of each of N polarized channels of a polar code whose code length is N based on a polar weight calculation formula:

$$W_i = \left( \sum_{j=0}^{n-1} B_j \cdot \beta^j + \sum_{m \in E} \frac{1}{2^m} \cdot B_j \times \beta^{\frac{1}{2^m}j} \right),$$

where $W_i$ represents a polar weight of an $i^{th}$ polarized channel, and $i \leq N$.

Alternatively, the processing unit 401 is further configured to: determine corrected polar weights of the N polarized channels based on a corrected polar weight calculation formula, where specifically, an order of the corrected polar weights of the N polarized channels is determined as the reliability-based order of the N polarized channels, where the corrected polar weight calculation formula is as follows:

W_Modified(j)=α*W(j)/max(W)+(1−α)*RW(j)/max (RW), where

PW_Modified(j) is a corrected polar weight of a $j^{th}$ polarized channel, where j=0, 1, 2, ..., N−1, a is a weighting coefficient, a is a positive constant greater than or equal to 0 and less than or equal to 1, for example, any value from 0.8-1, max(W) is a maximum polar weight value of a polarized channel, RW(j) is a row weight corresponding to the $j^{th}$ polarized channel, and max(RW) is a maximum row weight value of a polarized channel;

determine an information-bit sequence number set based on a quantity K of information bits and the polar weights of the N polarized channels; and perform decoding on a to-be-decoded sequence based on the information-bit sequence number set.

Alternatively, the processing unit 410 is configured to:

determine a maximum mother code sequence, where the maximum mother code sequence is the foregoing sequence #1; and perform decoding on a to-be-decoded sequence based on the maximum mother code sequence.

Alternatively, the processing unit 410 is configured to:

determine a maximum mother code sequence, where the maximum mother code sequence is the foregoing sequence #2; and perform decoding on a to-be-decoded sequence based on the maximum mother code sequence.

Figure 8:
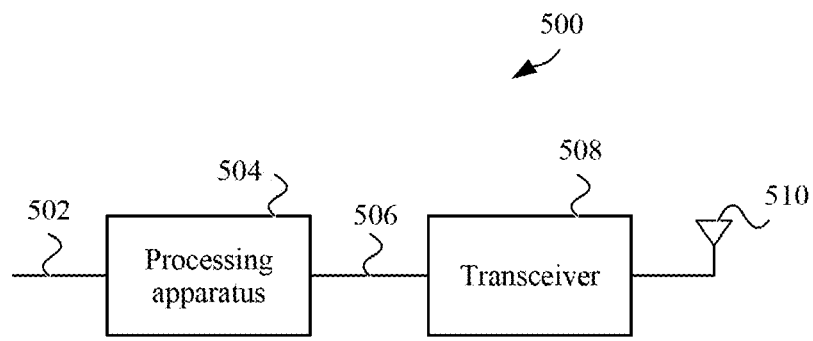
FIG. 8 shows a sending device 500 according to an embodiment of the present disclosure.

FIG. 8 shows a sending device 500 according to an embodiment of the present disclosure, to implement a coding function. The sending device 500 includes:

a transceiver 508, configured to obtain to-be-coded bits; and a processing apparatus 504, configured to select K non-punctured-position sequence numbers as a reference sequence number set based on a quantity K of information bits and a reliability-based order of N polarized channels of a polar code whose code length is N, where a reliability of a polarized channel corresponding to any sequence number in the reference sequence number set is greater than or equal to a highest reliability in reliabilities of polarized channels corresponding to remaining (N−K) sequence numbers, and K is greater than or equal to 1 and is an integer; where the processing apparatus 504 is further configured to determine an information-bit sequence number set based on a determining condition and the reference sequence number set, where the determining condition is set based on at least one of a code rate, a mother code length of the polar code, and a code weight; and the processing apparatus 504 is further configured to perform polar coding on the to-be-coded bits based on the information-bit sequence number set.

Alternatively, the processing apparatus 504 is configured to:

calculate polar weights of N polarized channels of a polar code whose code length is N based on a polar weight calculation formula, where the polar weight calculation formula is as follows:

$$W_i = \sum_{j=0}^{n-1} B_j \cdot a_1 \cdot [b_1 \cdot (2 \cdot c_1)^j + d_1]^{f_1} +$$

$$B_j \cdot a_2 \cdot [b_2 \cdot (2 \cdot c_2)^j + d_2]^{f_2} + (1 - B_j) \cdot a_3 \cdot [b_3 \cdot (2 \cdot c_3)^j + d_3]^{f_3},$$

where $W_i$ is a polar weight of an $i^{th}$ polarized channel, $i \in \{0, 1, \ldots, n-1\}$, $j \in \{0, 1, \ldots, n-1\}$, $B_j \in \{0,1\}$, $i = B_{n-1}B_{n-2} \ldots B_0$, $B_{n-1}B_{n-2} \ldots B_0$ is a binary expression of i, and a value range of each of $a_1$, $a_2$, $a_3$, $b_1$, $b_2$, $b_3$, $c_1$, $c_2$, $c_3$, $d_1$, $d_2$, $d_3$, $f_1$, $f_2$, and $f_3$ is [−2, 2];

determine an information-bit sequence number set based on a quantity K of information bits and the polar weights of the N polarized channels; and perform polar coding on to-be-coded bits based on the information-bit sequence number set.

Alternatively, the processing apparatus 504 is configured to:

calculate a polar weight of each of N polarized channels of a polar code whose code length is N based on a polar weight calculation formula:

$$W_i = \left(\sum_{j=0}^{n-1} B_j \cdot \beta^j + \sum_{m \in E} \frac{1}{2^m} \cdot B_j \times \beta^{\frac{1}{2^m}j}\right),$$

where $W_i$ represents a polar weight of an $i^{th}$ polarized channel, and $i \leq N$.

Alternatively, the processing apparatus 504 is further configured to: determine corrected polar weights of the N polarized channels based on a corrected polar weight calculation formula, where specifically, an order of the corrected polar weights of the N polarized channels is determined as the reliability-based order of the N polarized channels, where the corrected polar weight calculation formula is as follows:

W_Modified($j$)=α*$W(j)$/max($W$)+(1−α)*RW($j$)/max (RW), where

PW_Modified(j) is a corrected polar weight of a $j^{th}$ polarized channel, where j=0, 1, 2, . . . , N−1, a is a weighting coefficient, a is a positive constant greater than or equal to 0 and less than or equal to 1, for example, any value from 0.8-1, max(W) is a maximum polar weight value of a polarized channel, RW(j) is a row weight corresponding to the $j^{th}$ polarized channel, and max(RW) is a maximum row weight value of a polarized channel;

determine an information-bit sequence number set based on a quantity K of information bits and the polar weights of the N polarized channels; and perform polar coding on to-be-coded bits based on the information-bit sequence number set.

Alternatively, the processing apparatus 504 is configured to:

determine a maximum mother code sequence, where the maximum mother code sequence is the foregoing sequence #1; and perform polar coding on a to-be-coded sequence based on the maximum mother code sequence.

Alternatively, the processing apparatus 504 is configured to:

determine a maximum mother code sequence, where the maximum mother code sequence is the foregoing sequence #2; and perform polar coding on a to-be-coded sequence based on the maximum mother code sequence.

The foregoing sending device may be a network device communicating with a terminal, or may be a terminal device.

Figure 9:
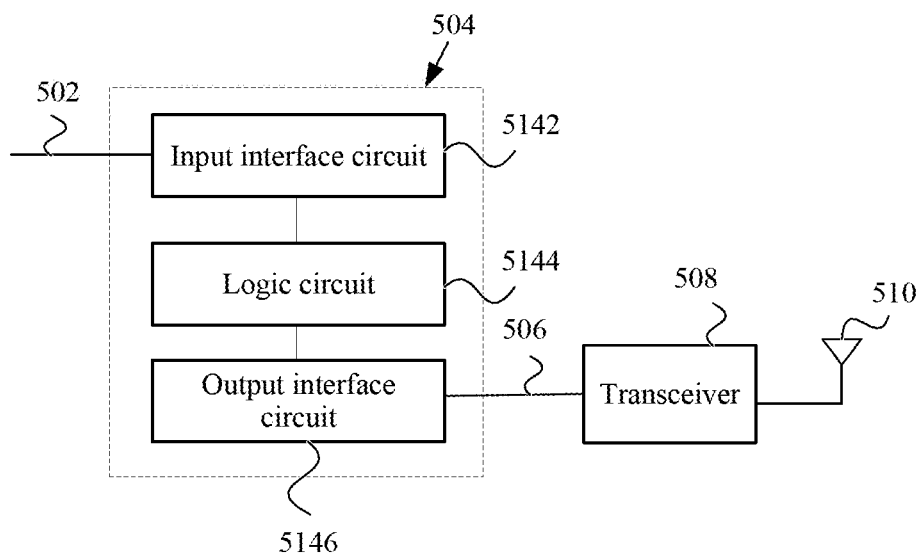
FIG. 9 is a schematic diagram of an internal structure of a processing apparatus of a sending device.

An embodiment of the present disclosure further provides a processing apparatus 504 for coding, to implement the coding method in the foregoing embodiments. The coding method in the foregoing embodiments may be completely or partially implemented by hardware or software. When hardware is used for implementation, refer to FIG. 9. FIG. 9 is a schematic diagram of an internal structure of a processing apparatus. The processing apparatus 504 includes:

an input interface circuit 5142, configured to obtain to-be-coded bits that are input:

a logic circuit 5144, configured to select K non-punctured-position sequence numbers as a reference sequence number set based on a quantity K of information bits and a reliability-based order of N polarized channels of a polar code whose code length is N, where a reliability of a polarized channel corresponding to any sequence number in the reference sequence number set is greater than or equal to a highest reliability in reliabilities of polarized channels corresponding to remaining (N−K) sequence numbers, and K is greater than or equal to 1 and is an integer; where the logic circuit 5144 is further configured to determine an information-bit sequence number set based on a determining condition and the reference sequence number set, where the determining condition is set based on at least one of a code rate, a mother code length of the polar code, and a code weight; and the logic circuit 5144 is further configured to perform polar coding on the to-be-coded bits based on the information-bit sequence number set; and an output interface circuit 5146, configured to output a polar-coded bit sequence.

The logic circuit 5144 may be configured to execute the coding method in the embodiments of the present disclosure. For details, refer to the description in the foregoing method embodiments. Details are not described herein again. In specific implementation, the processing apparatus may be a chip or an integrated circuit.

Alternatively, the logic circuit 5144 is configured to:

calculate polar weights of N polarized channels of a polar code whose code length is N based on a polar weight calculation formula, where the polar weight calculation formula is as follows:

$$W_i = \sum_{j=0}^{n-1} B_j \cdot a_1 \cdot [b_1 \cdot (2 \cdot c_1)^j + d_1]^{f_1} +$$
$$B_j \cdot a_2 \cdot [b_2 \cdot (2 \cdot c_2)^j + d_2]^{f_2} + (1 - B_j) \cdot a_3 \cdot [b_3 \cdot (2 \cdot c_3)^j + d_3]^{f_3},$$

where $W_i$ is a polar weight of an $i^{th}$ polarized channel, i∈{0, 1, . . . , n−1}, j∈{0, 1, . . . , n−1}, $B_j$∈{0,1}, i=$B_{n-1}B_{n-2}$ . . . $B_0$, $B_{n-1}B_{n-2}$ . . . $B_0$ is a binary expression of i, and a value range of each of $a_1$, $a_2$, $a_3$, $b_1$, $b_2$, $b_3$, $c_1$, $c_2$, $c_3$, $d_1$, $d_2$, $d_3$, $f_1$, $f_2$, and $f_3$ is [−2, 2];

determine an information-bit sequence number set based on a quantity K of information bits and the polar weights of the N polarized channels; and perform polar coding on to-be-coded bits based on the information-bit sequence number set.

Alternatively, the logic circuit 5144 is configured to:

calculate a polar weight of each of N polarized channels of a polar code whose code length is N based on a polar weight calculation formula:

$$W_i = \left(\sum_{j=0}^{n-1} B_j \cdot \beta^j + \sum_{m \in E} \frac{1}{2^m} \cdot B_j \times \beta^{\frac{1}{2^m}j}\right),$$

where $W_i$ represents a polar weight of an it polarized channel, and $i \leq N$.

Alternatively, the logic circuit 5144 is further configured to: determine corrected polar weights of the N polarized channels based on a corrected polar weight calculation formula, where specifically, an order of the corrected polar weights of the N polarized channels is determined as the reliability-based order of the N polarized channels, where the corrected polar weight calculation formula is as follows:

W_Modified($j$)=α*$W(j)$/max($W$)+(1−α)*RW($j$)/max (RW), where

PW_Modified(j) is a corrected polar weight of a $j^{th}$ polarized channel, where j=0, 1, 2, . . . , N−1, a is a weighting coefficient, a is a positive constant greater than or equal to 0 and less than or equal to 1, for example, any value from 0.8-1, max(W) is a maximum polar weight value of a polarized channel, RW(j) is a row weight corresponding to the $j^{th}$ polarized channel, and max(RW) is a maximum row weight value of a polarized channel;

determine an information-bit sequence number set based on a quantity K of information bits and the polar weights of the N polarized channels; and perform polar coding on to-be-coded bits based on the information-bit sequence number set.

Alternatively, the logic circuit 5144 is configured to:

determine a maximum mother code sequence, where the maximum mother code sequence is the foregoing sequence #1; and perform polar coding on a to-be-coded sequence based on the maximum mother code sequence.

Alternatively, the logic circuit 5144 is configured to:

determine a maximum mother code sequence, where the maximum mother code sequence is the foregoing sequence #2; and perform polar coding on a to-be-coded sequence based on the maximum mother code sequence.

Figure 10:
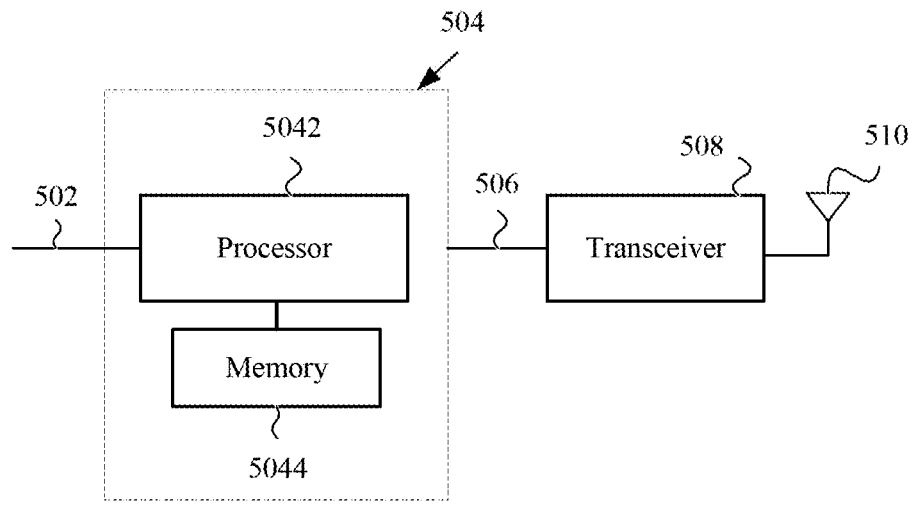
FIG. 10 is another schematic diagram of an internal structure of a processing apparatus of a sending device.

When the coding method in the foregoing embodiments is completely or partially implemented by software, refer to FIG. 10. FIG. 10 is another schematic diagram of an internal structure of a processing apparatus of a sending device. The processing apparatus 504 includes:

a memory 5044, configured to store a program; and a processor 5042, configured to execute the program stored in the memory, and when the program is executed, the processor executes the polar code coding method in the foregoing embodiments.

Figure 11:
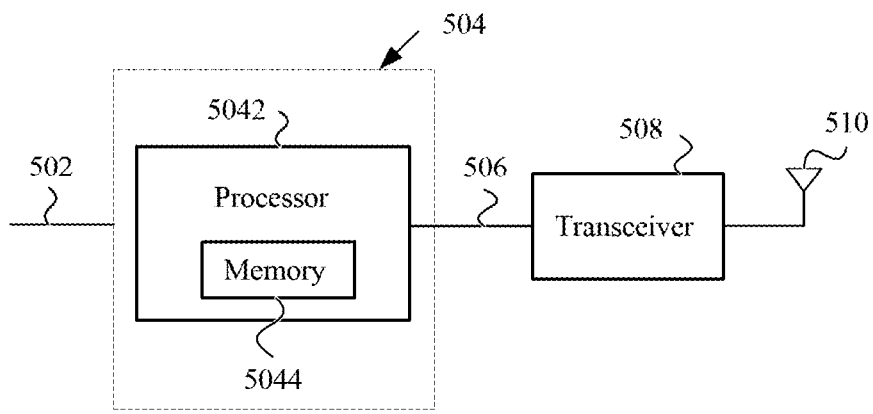
FIG. 11 is still another schematic diagram of an internal structure of a processing apparatus of a sending device.

The memory 5044 may be a physically independent unit. For details, refer to FIG. 10. Alternatively, the memory 5044 may be integrated with the processor 5042. For details, refer to FIG. 11. FIG. 11 is still another schematic diagram of an internal structure of a processing apparatus of a sending device.

In another embodiment, the processing apparatus may include only the processor. The memory is located outside the processing apparatus. The processor is connected to the memory through a circuit/wire, and is configured to read and execute the program stored in the memory.

Figure 12:
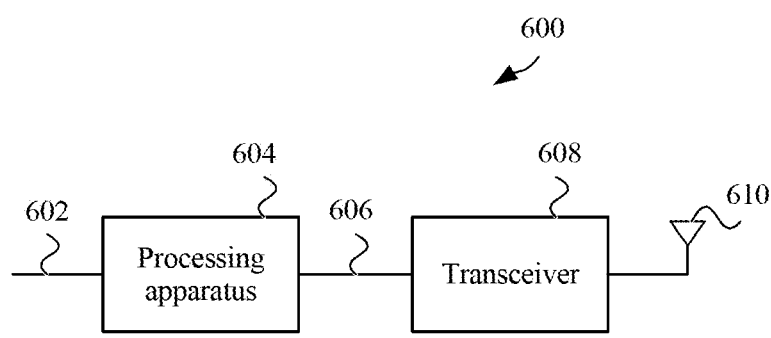
FIG. 12 shows a receiving device 600 according to an embodiment of the present disclosure.

FIG. 12 shows a receiving device 600 according to an embodiment of the present disclosure. Referring to FIG. 12, the receiving device includes:

a transceiver 608, configured to obtain a to-be-decoded sequence; and a processing apparatus 604, configured to select K non-punctured-position sequence numbers as a reference sequence number set based on a quantity K of information bits and a reliability-based order of N polarized channels of a polar code whose code length is N, where a reliability of a polarized channel corresponding to any sequence number in the reference sequence number set is greater than or equal to a highest reliability in reliabilities of polarized channels corresponding to remaining (N−K) sequence numbers, and K is greater than or equal to 1 and is an integer; where the processing apparatus 604 is further configured to determine an information-bit sequence number set based on a determining condition and the reference sequence number set, where the determining condition is set based on at least one of a code rate, a mother code length of the polar code, and a code weight; and the processing apparatus 604 is further configured to perform decoding on the to-be-decoded sequence based on the information-bit sequence number set.

Alternatively, the processing apparatus 604 is configured to:

calculate polar weights of N polarized channels of a polar code whose code length is N based on a polar weight calculation formula, where the polar weight calculation formula is as follows:

$$W_i = \sum_{j=0}^{n-1} B_j \cdot a_1 \cdot [b_1 \cdot (2 \cdot c_1)^j + d_1]^{f_1} +$$
$$B_j \cdot a_2 \cdot [b_2 \cdot (2 \cdot c_2)^j + d_2]^{f_2} + (1 - B_j) \cdot a_3 \cdot [b_3 \cdot (2 \cdot c_3)^j + d_3]^{f_3},$$

where $W_i$ is a polar weight of an $i^{th}$ polarized channel, $i \in \{0, 1, \ldots, n-1\}$, $j \in \{0, 1, \ldots, n-1\}$, $B_j \in \{0,1\}$, $i = B_{n-1} B_{n-2} \ldots B_0$, $B_{n-1} B_{n-2} \ldots B_0$ is a binary expression of i, and a value range of each of $a_1$, $a_2$, $a_3$, $b_1$, $b_2$, $b_3$, $c_1$, $c_2$, $c_3$, $d_1$, $d_2$, $d_3$, $f_1$, $f_2$, and $f_3$ is [−2, 2];

determine an information-bit sequence number set based on a quantity K of information bits and the polar weights of the N polarized channels; and perform decoding on a to-be-decoded sequence based on the information-bit sequence number set.

Alternatively, the processing apparatus 604 is configured to:

calculate a polar weight of each of N polarized channels of a polar code whose code length is N based on a polar weight calculation formula:

$$W_i = \left( \sum_{j=0}^{n-1} B_j \cdot \beta^j + \sum_{m \in E} \frac{1}{2^m} \cdot B_j \times \beta^{\frac{1}{2^m} j} \right),$$

where $W_i$ represents a polar weight of an $i^{*h}$ polarized channel, and $i \leq N$.

Alternatively, the processing apparatus 604 is further configured to: determine corrected polar weights of the N polarized channels based on a corrected polar weight calculation formula, where specifically, an order of the corrected polar weights of the N polarized channels is determined as the reliability-based order of the N polarized channels, where the corrected polar weight calculation formula is as follows:

$W\_Modified(j) = \alpha * W(j)/\max(W) + (1-\alpha) * RW(j)/\max(RW)$, where

PW_Modified(j) is a corrected polar weight of a $j^{th}$ polarized channel, where j=0, 1, 2, . . . , N−1, a is a weighting coefficient, a is a positive constant greater than or equal to 0 and less than or equal to 1, for example, any value from 0.8-1, max(W) is a maximum polar weight value of a polarized channel, RW(j) is a row weight corresponding to the $j^{th}$ polarized channel, and max(RW) is a maximum row weight value of a polarized channel;

determine an information-bit sequence number set based on a quantity K of information bits and the polar weights of the N polarized channels; and perform decoding on a to-be-decoded sequence based on the information-bit sequence number set.

Alternatively, the processing apparatus 604 is configured to:

determine a maximum mother code sequence, where the maximum mother code sequence is the foregoing sequence #1; and perform decoding on a to-be-decoded sequence based on the maximum mother code sequence.

Alternatively, the processing apparatus 604 is configured to:

determine a maximum mother code sequence, where the maximum mother code sequence is the foregoing sequence #2; and perform decoding on a to-be-decoded sequence based on the maximum mother code sequence.

An embodiment of the present disclosure further provides a processing apparatus 604 for decoding, to implement the decoding method in the foregoing embodiments. The decoding method in the foregoing embodiments may be completely or partially implemented by hardware or software. A structure of the processing apparatus 604 is the same as the processing apparatus in the foregoing coding apparatus, and a difference lies only in an implemented function. Therefore, only the difference is described herein.

Figure 13:
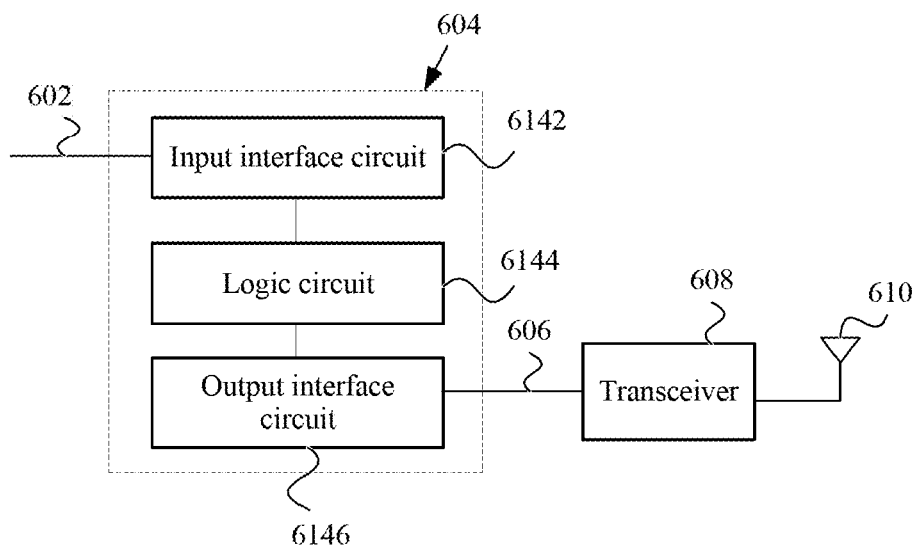
FIG. 13 is a schematic diagram of an internal structure of a processing apparatus of a receiving device.

FIG. 13 is a schematic diagram of an internal structure of a processing apparatus of a receiving device. The processing apparatus includes:

an input interface circuit 6142, configured to obtain to-be-coded bits that are input;

a logic circuit 6144 in the processing apparatus 604, configured to: when the processing apparatus 604 is implemented by hardware, select K non-punctured-position sequence numbers as a reference sequence number set based on a quantity K of information bits and a reliability-based order of N polarized channels of a polar code whose code length is N, where a reliability of a polarized channel corresponding to any sequence number in the reference sequence number set is greater than or equal to a highest reliability in reliabilities of polarized channels corresponding to remaining (N−K) sequence numbers, and K is greater than or equal to 1 and is an integer; where the logic circuit 6144 is further configured to determine an information-bit sequence number set based on a determining condition and the reference sequence number set, where the determining condition is set based on at least one of a code rate, a mother code length of the polar code, and a code weight; and the logic circuit 6144 is further configured to perform decoding on a to-be-decoded sequence based on the information-bit sequence number set; and an output interface circuit 6146, configured to output a decoded bit sequence.

Alternatively, the logic circuit 6144 is configured to:

calculate polar weights of N polarized channels of a polar code whose code length is N based on a polar weight calculation formula, where the polar weight calculation formula is as follows:

$$W_i = \sum_{j=0}^{n-1} B_j \cdot a_1 \cdot [b_1 \cdot (2 \cdot c_1)^j + d_1]^{f_1} +$$

$$B_j \cdot a_2 \cdot [b_2 \cdot (2 \cdot c_2)^j + d_2]^{f_2} + (1 - B_j) \cdot a_3 \cdot [b_3 \cdot (2 \cdot c_3)^j + d_3]^{f_3},$$

where $W_i$ is a polar weight of an $i^{th}$ polarized channel, $i \in \{0, 1, \ldots, n-1\}$, $j \in \{0, 1, \ldots, n-1\}$, $B_j \in \{0,1\}$, $i = B_{n-1}B_{n-2} \ldots B_0$, $B_{n-1}B_{n-2} \ldots B_0$ is a binary expression of i, and a value range of each of $a_1$, $a_2$, $a_3$, $b_1$, $b_2$, $b_3$, $c_1$, $c_2$, $c_3$, $d_1$, $d_2$, $d_3$, $f_1$, $f_2$, and $f_3$ is [−2, 2];

determine an information-bit sequence number set based on a quantity K of information bits and the polar weights of the N polarized channels; and perform decoding on a to-be-decoded sequence based on the information-bit sequence number set.

Alternatively, the logic circuit 6144 is configured to:

calculate a polar weight of each of N polarized channels of a polar code whose code length is N based on a polar weight calculation formula:

$$W_i = \left( \sum_{j=0}^{n-1} B_j \cdot \beta^j + \sum_{m \in E} \frac{1}{2^m} \cdot B_j \times \beta^{\frac{1}{2^m} j} \right),$$

where $W_i$ represents a polar weight of an $i^{th}$ polarized channel, and $i \leq N$;

determine an information-bit sequence number set based on a quantity K of information bits and the polar weights of the N polarized channels; and perform decoding on a to-be-decoded sequence based on the information-bit sequence number set.

Alternatively, the logic circuit 6144 is configured to:

determine a maximum mother code sequence, where the maximum mother code sequence is the foregoing sequence #1; and perform decoding on a to-be-decoded sequence based on the maximum mother code sequence.

Alternatively, the logic circuit 6144 is configured to:

determine a maximum mother code sequence, where the maximum mother code sequence is the foregoing sequence #2; and perform decoding on a to-be-decoded sequence based on the maximum mother code sequence.

The logic circuit 6144 may be configured to execute the decoding method in the embodiments of the present disclosure. For details, refer to the description about a decoding side in the foregoing method embodiments. Details are not described herein again. In specific implementation, the processing apparatus 604 may be a chip or an integrated circuit.

The decoding method in the foregoing embodiments may be completely or partially implemented by hardware or software. A processor 6042 in the processing apparatus is configured to execute a program stored in a memory, and when the program is executed, the processor 6042 executes the polar code decoding method in the foregoing embodiments.

Figure 14:
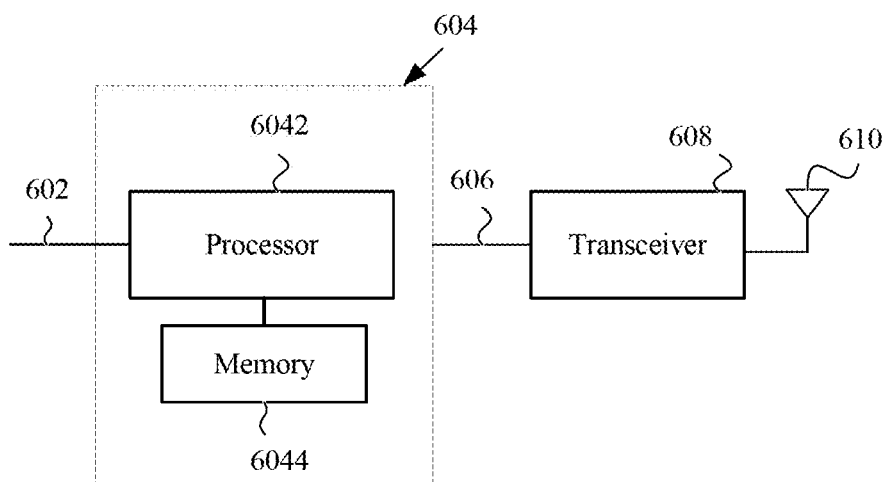
FIG. 14 is another schematic diagram of an internal structure of a processing apparatus of a receiving device.
Figure 15:
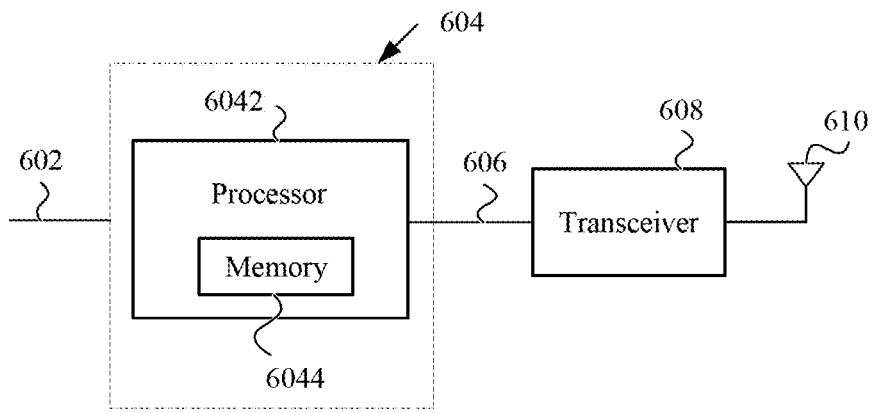
FIG. 15 is still another schematic diagram of an internal structure of a processing apparatus of a receiving device.

The memory 6044 may be a physically independent unit. For details, refer to FIG. 14. FIG. 14 is another schematic diagram of an internal structure of a processing apparatus of a receiving device. Alternatively, the memory 6044 may be integrated with the processor 6042. For details, refer to FIG. 15. FIG. 15 is still another schematic diagram of an internal structure of a processing apparatus of a receiving device.

In another embodiment, the processing apparatus may include only the processor. The memory is located outside the processing apparatus. The processor is connected to the memory through a circuit/wire, and is configured to read and execute the program stored in the memory.

The processing apparatus for coding and the processing apparatus for decoding in the embodiments of the present disclosure may be independent of each other in actual application, or may be integrated together, that is, form one apparatus.

Figure 16:
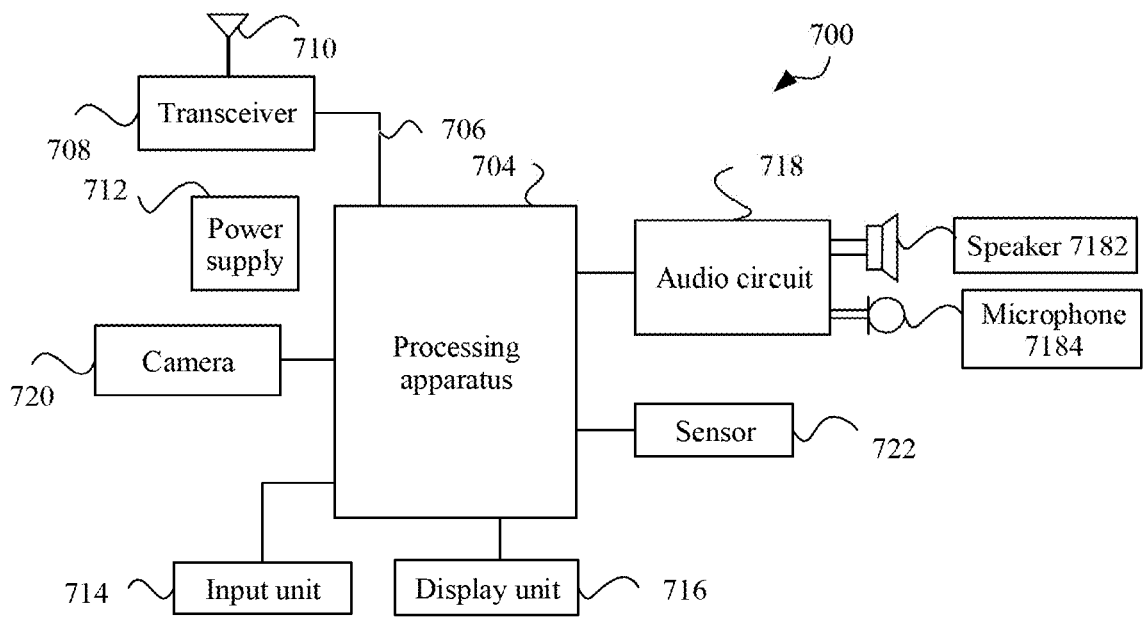
FIG. 16 is a schematic structural diagram of a terminal device 700.

The sending device or the receiving device may be a terminal device (referred to as a terminal below), or may be a network device. When the sending device or the receiving device is a terminal, refer to FIG. 16. FIG. 16 is a schematic structural diagram of a terminal device 700. The terminal 700 may further include a power supply 712, configured to supply power to various components or circuits in the terminal. The terminal may further include an antenna 710, configured to send, by using a radio signal, uplink data that is output by a transceiver, or output a received radio signal to the transceiver.

In addition, for more comprehensive functions of the terminal, the terminal may further include one or more of an input unit 714, a display unit 716, an audio circuit 718, a camera 720, a sensor 722, and the like. The audio circuit may include a speaker 7182, a microphone 7184, and the like.

With reference to the foregoing description, a person skilled in the art can be aware that the method in the embodiments in this specification may be implemented by hardware (for example, logic circuit), or software, or a combination of hardware and software. Whether the functions are performed by hardware or software depends on particular applications and design constraint conditions of the technical solutions. A person skilled in the art may use different methods to implement the described functions for each particular application, but it should not be considered that the implementation goes beyond the scope of the present disclosure.

When the functions are implemented in a form of software and sold or used as an independent product, the functions may be stored in a computer-readable storage medium. In this case, the technical solutions of the present disclosure essentially, or the part contributing to the prior art, or some of the technical solutions may be implemented in a form of a software product. The computer software product is stored in a storage medium, and includes several instructions for instructing a computer device (which may be a personal computer, a server, or a network device) to perform all or some of the operations of the methods described in the embodiments of the present disclosure. The foregoing storage medium includes: various media that can store program code, such as a USB flash drive, a removable hard disk, a read-only memory (ROM), a random access memory (RAM), a magnetic disk, or an optical disc.

The foregoing descriptions are merely specific implementations of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. A polar code coding method, comprising:
   selecting, by a sending device, K non-punctured-position sequence numbers as a reference sequence number set based on a quantity K of information bits and a reliability-based order of N polarized channels of a polar code whose code length is N, wherein a reliability of a polarized channel corresponding to any sequence number in the reference sequence number set is greater than or equal to a highest reliability in reliabilities of polarized channels corresponding to remaining (N−K) sequence numbers, and K is greater than or equal to 1 and is an integer;
   determining, by the sending device, an information-bit sequence number set based on a determining condition and the reference sequence number set, wherein the determining condition is a condition for the sending device to determine whether to directly use the reference sequence number set as the information-bit sequence number, and is set based on at least one of a code rate, a mother code length of the polar code, and a code weight; and
   performing, by the sending device, polar coding on to-be-coded bits based on the information-bit sequence number set.

2. The method according to claim 1, wherein the determining, by the sending device, an information-bit sequence number set based on a determining condition and the reference sequence number set comprises:
   if the determining condition is not met, determining, by the sending device, the reference sequence number set as the information-bit sequence number set.

3. The method according to claim 1, wherein the determining, by the sending device, an information-bit sequence number set based on a determining condition and the reference sequence number set comprises:
   if the determining condition is met, determining, by the sending device, $K_1$ first sequence numbers in the reference sequence number set, wherein a code weight corresponding to each of the $K_1$ first sequence numbers is $W_{min}$, and $W_{min}$ is equal to a minimum code weight in K code weights respectively corresponding to the K non-punctured-position sequence numbers; and
   selecting, by the sending device, $K_2$ second sequence numbers from available sequence numbers to replace $K_2$ first sequence numbers in the $K_1$ first sequence numbers, to obtain the information-bit sequence number set, wherein the available sequence numbers are sequence numbers in sequence numbers of the N polarized channels other than the reference sequence number set and a punctured-position sequence number, and $K_2 \leq K_1$, wherein
   the $K_2$ second sequence numbers meet any one of the following conditions:
   a code weight corresponding to each of the $K_2$ second sequence numbers is greater than $W_{min}$, and a reliability of a polarized channel corresponding to each second sequence number is greater than or equal to a reliability of a polarized channel corresponding to any one of a sequence number in the available sequence numbers other than the second sequence number and the punctured-position sequence number;
   a minimum sequence number in the $K_2$ second sequence numbers is greater than a maximum sequence number in the available sequence numbers other than the $K_2$ second sequence numbers; and
   a code weight of each of the $K_2$ second sequence numbers is greater than or equal to $2 W_{min}$.

4. The method according to claim 1, wherein the determining condition is at least one of the following conditions:
   a mother code length is greater than or equal to a preset mother code length threshold;
   a code rate is greater than or equal to a preset code rate threshold;
   a quantity of minimum code weights in code weights corresponding to $K_1$ non-punctured-position sequence numbers comprised in the reference sequence number set is greater than or equal to a quantity threshold; and
   a minimum code weight in code weights corresponding to sequence numbers in the reference sequence number set is less than or equal to a preset code weight threshold.

5. The method according to claim 4, wherein when the determining condition is that a minimum code weight in code weights corresponding to sequence numbers in the reference sequence number set is less than or equal to a preset code weight threshold, the method further comprises:
calculating, by the sending device, $K_1$ code weights corresponding to $K_1$ sequence numbers comprised in the reference sequence number set; and
determining, by the sending device, a minimum code weight in the $K_1$ code weights corresponding to the $K_1$ sequence numbers.

6. The method according to claim 1, further comprising:
determining, by the sending device, polar weights of the N polarized channels based on a polar weight calculation formula; and
determining, by the sending device, an order of the polar weights of the N polarized channels as the reliability-based order of the N polarized channels, wherein
the polar weight calculation formula is as follows:

$$W_i = \sum_{j=0}^{n-1} B_j \cdot a_1 \cdot [b_1 \cdot (2 \cdot c_1)^j + d_1]^{f_1} + B_j \cdot a_2 \cdot [b_2 \cdot (2 \cdot c_2)^j + d_2]^{f_2} + (1 - B_j) \cdot a_3 \cdot [b_3 \cdot (2 \cdot c_3)^j + d_3]^{f_3},$$

wherein $W_i$ is a polar weight of an $i^{th}$ polarized channel, $i \in \{0, 1, \ldots, n-1\}$, $j \in \{0, 1, \ldots, n-1\}$, $B_j \in \{0,1\}$, $i = B_{n-1}B_{n-2} \ldots B_0$, $B_{n-1}B_{n-2} \ldots B_0$ is a binary expression of i, and a value range of each of $a_1$, $a_2$, $a_3$, $b_1$, $b_2$, $b_3$, $c_1$, $c_2$, $c_3$, $d_1$, $d_2$, $d_3$, $f_1$, $f_2$, and $f_3$ is $[-2, 2]$.

7. The method according to claim 6, wherein a group of values of $(a_1, b_1, c_1, d_1, f_1)$ is $(1, 1.07, 1, 0.5, \frac{1}{4})$, $(1, 1.1, 1, 0.5, 1, \frac{1}{4})$, or $(1, 1, 1, 0, \frac{1}{4})$, and $a_2 = a_3 = 0$.

8. The method according to claim 6, wherein a group of values of $(a_1, b_1, c_1, d_1, f_1)$ is $(1, 1.07, 1, 0.5, \frac{1}{4})$, $(1, 1.1, 1, 0.5, 1, \frac{1}{4})$, or $(1, 1, 1, 0, \frac{1}{4})$, a group of values of $(a_2, b_2, c_2, d_2, f_2)$ is $(\frac{1}{4}, 1, 1, 0, \frac{1}{16})$, and $a_3 = 0$.

9. The method according to claim 6, wherein a group of values of $(a_1, b_1, c_1, d_1, f_1)$ is $(1, 1.07, 1, 0.5, \frac{1}{4})$, $(1, 1.1, 1, 0.5, 1, \frac{1}{4})$, or $(1, 1, 1, 0, \frac{1}{4})$, a group of values of $(a_3, b_3, c_3, d_3, f_3)$ is $(1, 1.2, 1, 0, 1)$, and $a_2 = 0$.

10. A polar code coding method, comprising:
calculating, by a sending device, polar weights of N polarized channels of a polar code whose code length is N based on a polar weight calculation formula, wherein the polar weight calculation formula is as follows:

$$W_i = \sum_{j=0}^{n-1} B_j \cdot a_1 \cdot [b_1 \cdot (2 \cdot c_1)^j + d_1]^{f_1} + B_j \cdot a_2 \cdot [b_2 \cdot (2 \cdot c_2)^j + d_2]^{f_2} + (1 - B_j) \cdot a_3 \cdot [b_3 \cdot (2 \cdot c_3)^j + d_3]^{f_3},$$

wherein $W_i$ is a polar weight of an $i^{th}$ polarized channel, $i \in \{0, 1, \ldots, n-1\}$, $j \in \{0, 1, \ldots, n-1\}$, $B_j \in \{0,1\}$, $i = B_{n-1}B_{n-2} \ldots B_0$, $B_{n-1}B_{n-2} \ldots B_0$ is a binary expression of i, and a value range of each of $a_1$, $a_2$, $a_3$, $b_1$, $b_2$, $b_3$, $c_1$, $c_2$, $c_3$, $d_1$, $d_2$, $d_3$, $f_1$, $f_2$, and $f_3$ is $[-2, 2]$;
determining, by the sending device, an information-bit sequence number set based on a quantity K of information bits and the polar weights of the N polarized channels; and
performing, by the sending device, polar coding on to-be-coded bits based on the information-bit sequence number set.

11. The method according to claim 10, wherein a group of values of $(a_1, b_1, c_1, d_1, f_1)$ is $(1, 1.07, 1, 0.5, \frac{1}{4})$, $(1, 1.1, 1, 0.5, 1, \frac{1}{4})$, or $(1, 1, 1, 0, \frac{1}{4})$, and $a_2 = a_3 = 0$.

12. The method according to claim 10, wherein a group of values of $(a_1, b_1, c_1, d_1, f_1)$ is $(1, 1.07, 1, 0.5, \frac{1}{4})$, $(1, 1.1, 1, 0.5, 1, \frac{1}{4})$, or $(1, 1, 1, 0, \frac{1}{4})$, a group of values of $(a_2, b_2, c_2, d_2, f_2)$ is $(\frac{1}{4}, 1, 1, 0, \frac{1}{16})$, and $a_3 = 0$.

13. The method according to claim 10, wherein a group of values of $(a_1, b_1, c_1, d_1, f_1)$ is $(1, 1.07, 1, 0.5, \frac{1}{4})$, $(1, 1.1, 1, 0.5, 1, \frac{1}{4})$, or $(1, 1, 1, 0, \frac{1}{4})$, a group of values of $(a_3, b_3, c_3, d_3, f_3)$ is $(1, 1.2, 1, 0, 1)$, and $a_2 = 0$.

14. A polar code decoding method, comprising:
selecting, by a receiving device, K non-punctured-position sequence numbers as a reference sequence number set based on a quantity K of information bits and a reliability-based order of N polarized channels of a polar code whose code length is N, wherein a reliability of a polarized channel corresponding to any sequence number in the reference sequence number set is greater than or equal to a highest reliability in reliabilities of polarized channels corresponding to remaining (N−K) sequence numbers, and K is greater than or equal to 1 and is an integer;
determining, by the receiving device, an information-bit sequence number set based on a determining condition and the reference sequence number set, wherein the determining condition is a condition for the receiving device to determine whether to directly use the reference sequence number set as the information-bit sequence number, and is set based on at least one of a code rate, a mother code length of the polar code, and a code weight; and
performing, by the receiving device, decoding on a to-be-decoded sequence based on the information-bit sequence number set.

15. The method according to claim 14, wherein the determining, by the receiving device, an information-bit sequence number set based on a determining condition and the reference sequence number set comprises:
if the determining condition is not met, determining, by the receiving device, the reference sequence number set as the information-bit sequence number set.

16. The method according to claim 14, wherein the determining, by the receiving device, an information-bit sequence number set based on a determining condition and the reference sequence number set comprises:
if the determining condition is met, determining, by the receiving device, $K_1$ first sequence numbers in the reference sequence number set, wherein a code weight corresponding to each of the $K_1$ first sequence numbers is $W_{min}$, and $W_{min}$ is equal to a minimum code weight in K code weights respectively corresponding to the K non-punctured-position sequence numbers; and
selecting, by the receiving device, $K_2$ second sequence numbers from available sequence numbers to replace $K_2$ first sequence numbers in the $K_1$ first sequence numbers, to obtain the information-bit sequence number set, wherein the available sequence numbers are sequence numbers in sequence numbers of the N polarized channels other than the reference sequence number set and a punctured-position sequence number, and $K_2 \leq K_1$, wherein
the $K_2$ second sequence numbers meet any one of the following conditions:

a code weight corresponding to each of the $K_2$ second sequence numbers is greater than $W_{min}$, and a reliability of a polarized channel corresponding to each second sequence number is greater than or equal to a reliability of a polarized channel corresponding to any one of a sequence number in the available sequence numbers other than the second sequence number and the punctured-position sequence number;

a minimum sequence number in the $K_2$ second sequence numbers is greater than a maximum sequence number in the available sequence numbers other than the $K_2$ second sequence numbers; and a code weight of each of the $K_2$ second sequence numbers is greater than or equal to $2W_{min}$.

17. The method according to claim 14, wherein the determining condition is at least one of the following conditions:

a mother code length is greater than or equal to a preset mother code length threshold;

a code rate is greater than or equal to a preset code rate threshold;

a quantity of minimum code weights in code weights corresponding to $K_1$ non-punctured-position sequence numbers comprised in the reference sequence number set is greater than or equal to a quantity threshold; and a minimum code weight in code weights corresponding to sequence numbers in the reference sequence number set is less than or equal to a preset code weight threshold.

18. The method according to claim 17, further comprising:

determining, by the receiving device, polar weights of the N polarized channels based on a polar weight calculation formula; and determining, by the receiving device, an order of the polar weights of the N polarized channels as the reliability-based order of the N polarized channels, wherein the polar weight calculation formula is as follows:

$$W_i = \sum_{j=0}^{n-1} B_j \cdot a_1 \cdot [b_1 \cdot (2 \cdot c_1)^j + d_1]^{f_1} + B_j \cdot a_2 \cdot [b_2 \cdot (2 \cdot c_2)^j + d_2]^{f_2} + (1 - B_j) \cdot a_3 \cdot [b_3 \cdot (2 \cdot c_3)^j + d_3]^{f_3},$$

wherein $W_i$ is a polar weight of an $i^{th}$ polarized channel, $i \in \{0, 1, \ldots, n-1\}$, $j \in \{0, 1, \ldots, n-1\}$, $B_j \in \{0, 1\}$, $i = B_{n-1}B_{n-2} \ldots B_0$, $B_{n-1}B_{n-2} \ldots B_0$ is a binary expression of i, and a value range of each of $a_1$, $a_2$, $a_3$, $b_1$, $b_2$, $b_3$, $c_1$, $c_2$, $c_3$, $d_1$, $d_2$, $d_3$, $f_1$, $f_2$, and $f_3$ is $[-2, 2]$.

19. The method according to claim 18, wherein a group of values of $(a_1, b_1, c_1, d_1, f_1)$ is $(1, 1.07, 1, 0.5, 1/4)$, $(1, 1.1, 1, 0.5, 1, 1/4)$, or $(1, 1, 1, 0, 1/4)$, and $a_2 = a_3 = 0$.

20. The method according to claim 18, wherein a group of values of $(a_1, b_1, c_1, d_1, f_1)$ is $(1, 1.07, 1, 0.5, 1/4)$, $(1, 1.1, 1, 0.5, 1, 1/4)$, or $(1, 1, 1, 0, 1/4)$, a group of values of $(a_2, b_2, c_2, d_2, f_2)$ is $(1/4, 1, 1, 0, 1/16)$, and $a_3 = 0$.

* * * * *